(12) United States Patent
Lee et al.

(10) Patent No.: US 12,274,120 B2
(45) Date of Patent: Apr. 8, 2025

(54) DISPLAY APPARATUS INCLUDING CAPPING LAYER

(71) Applicant: Samsung Display Co., Ltd., Yongin-si (KR)

(72) Inventors: Hongyeon Lee, Yongin-si (KR); Seungyeon Jeong, Yongin-si (KR); Beohmrock Choi, Yongin-si (KR); Ohjeong Kwon, Yongin-si (KR); Hongjo Park, Yongin-si (KR); Sujeong Kim, Yongin-si (KR); Kyunghee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 454 days.

(21) Appl. No.: 17/586,306

(22) Filed: Jan. 27, 2022

(65) Prior Publication Data

US 2022/0238841 A1    Jul. 28, 2022

(30) Foreign Application Priority Data

Jan. 28, 2021    (KR) .................. 10-2021-0012653

(51) Int. Cl.
| | |
|---|---|
| *H10K 50/84* | (2023.01) |
| *H10K 50/80* | (2023.01) |
| *H10K 50/844* | (2023.01) |
| *H10K 59/12* | (2023.01) |
| *H10K 59/38* | (2023.01) |

(Continued)

(52) U.S. Cl.
CPC ......... *H10K 50/844* (2023.02); *H10K 50/841* (2023.02); *H10K 50/868* (2023.02); *H10K 59/12* (2023.02); *H10K 59/38* (2023.02); *H10K 59/40* (2023.02); *H10K 50/15* (2023.02); *H10K 50/16* (2023.02); *H10K 50/17* (2023.02); *H10K 50/171* (2023.02); *H10K 59/1213* (2023.02);

(Continued)

(58) Field of Classification Search
CPC ............... H10K 50/844; H10K 50/841; H10K 50/868; H10K 50/86; H10K 50/858; H10K 50/856; H10K 50/8426; H10K 50/85; H10K 50/15; H10K 50/16; H10K 50/17; H10K 50/171; H10K 59/12; H10K 59/38; H10K 59/40; H10K 59/124; H10K 59/122; H10K 59/35; H10K 59/1216; C09B 57/00

See application file for complete search history.

(56) References Cited

U.S. PATENT DOCUMENTS

| | | | |
|---|---|---|---|
| 10,734,452 B1 * | 8/2020 | Kim | ............... H10K 50/856 |
| 2012/0280612 A1 | 11/2012 | Lee et al. | |

(Continued)

FOREIGN PATENT DOCUMENTS

| | | |
|---|---|---|
| KR | 10-1076262 | 10/2011 |
| KR | 10-2013-0014103 | 2/2013 |

(Continued)

*Primary Examiner* — Ida M Soward
(74) *Attorney, Agent, or Firm* — Womble Bond Dickinson (US) LLP

(57) ABSTRACT

A display apparatus includes: a substrate; a display device layer disposed on the substrate and including an organic light-emitting device; a low-reflection inorganic layer disposed on the display device layer and including an inorganic material; a capping layer disposed on the low-reflection inorganic layer, and a reflection adjusting layer disposed on the capping layer.

20 Claims, 10 Drawing Sheets

(51) Int. Cl.
*H10K 59/40* (2023.01)
*H10K 50/15* (2023.01)
*H10K 50/16* (2023.01)
*H10K 50/17* (2023.01)
*H10K 59/121* (2023.01)
*H10K 59/122* (2023.01)
*H10K 59/124* (2023.01)
*H10K 59/35* (2023.01)

(52) U.S. Cl.
CPC ....... *H10K 59/1216* (2023.02); *H10K 59/122* (2023.02); *H10K 59/124* (2023.02); *H10K 59/35* (2023.02)

(56) References Cited

U.S. PATENT DOCUMENTS

| | | | |
|---|---|---|---|
| 2013/0026456 | A1 | 1/2013 | Hwang et al. |
| 2016/0079567 | A1* | 3/2016 | Cho ................. H10K 50/86 257/40 |
| 2016/0307968 | A1 | 10/2016 | Yoon et al. |
| 2018/0197921 | A1* | 7/2018 | Kim ................. H10K 50/8426 |
| 2019/0115404 | A1* | 4/2019 | Moon ................. H10K 59/879 |
| 2019/0121176 | A1* | 4/2019 | Lee ................. G02F 1/133617 |
| 2019/0165074 | A1* | 5/2019 | Lee ................. H10K 59/126 |
| 2020/0066804 | A1* | 2/2020 | Jung ................. H10K 59/38 |
| 2020/0091247 | A1* | 3/2020 | Lee ................. G06F 3/044 |
| 2021/0200363 | A1* | 7/2021 | Lee ................. H10K 50/84 |

FOREIGN PATENT DOCUMENTS

| | | |
|---|---|---|
| KR | 10-2015-0047794 | 5/2015 |
| KR | 10-2016-0124274 | 10/2016 |

\* cited by examiner

DISPLAY APPARATUS INCLUDING CAPPING LAYER

CROSS-REFERENCE TO RELATED APPLICATIONS

This application claims priority from and the benefit of Korean Patent Application No. 10-2021-0012653, filed on Jan. 28, 2021, which is hereby incorporated by reference for all purposes as if fully set forth herein.

BACKGROUND

Field

Embodiments of the invention relate generally to a display apparatus, and more particularly, to a display apparatus having high light efficiency while effectively reducing external light reflectance.

Discussion of the Background

Organic light-emitting display apparatuses have self-emissive characteristics and do not need separate light sources unlike liquid crystal display apparatuses, and thus, the thickness and weight of organic light-emitting display apparatuses may be reduced. In addition, organic light-emitting display apparatuses have high-quality characteristics in terms of low power consumption, high luminance, high response speed, and the like. In order to allow images implemented via organic light-emitting display apparatuses to be readable both indoors and outdoors (outside), a polarizing plate or a color filter may generally be utilized.

The above information disclosed in this Background section is only for understanding of the background of the inventive concepts, and, therefore, it may contain information that does not constitute prior art.

SUMMARY

Applicant realized that polarizing plates may reduce the brightness of light emitted from display apparatuses and have high thicknesses, thereby increasing the thicknesses of the display apparatuses. In addition, while it is known to introduce an additional layer to improve the flatness of a microcavity structure using a color filter to improve poor reflectance and the reflective color band that appears, Applicant realized that the additional layer for improving flatness increases the thickness of the display panel and causes several inefficiencies.

Display apparatus constructed according to the principles and illustrative implementations of the invention have excellent spectral characteristics as external light reflectance is reduced to improve visibility, light efficiency is high, and/or color coordinate changes due to the viewing angle are reduced.

Display apparatus constructed according to the principles and illustrative implementations of the invention may avoid the use of conventional components including a polarizing plate and a color conversion member such as a color filter, or a wavelength conversion member. Compared to the case of using a polarizing plate, Applicant discovered that display apparatuses including a low-reflection inorganic layer and the reflection adjusting layer constructed according to the principles and illustrative implementations of the invention have the same or better performance in terms of preventing reflection of external light, and excellent light efficiency, which may be achieved by minimizing a decrease in the width of the brightness of emitted light.

Compared to the case of using a color conversion member or a wavelength conversion member, Applicant discovered that display apparatuses including a low-reflection inorganic layer and the reflection adjusting layer constructed according to the principles and illustrative implementations of the invention have the same or better performance in terms of preventing reflection of external light and/or excellent light efficiency because brightness of light emitted by optionally absorbing light of a specific wavelength does not decrease.

Additional features of the inventive concepts will be set forth in the description which follows, and in part will be apparent from the description, or may be learned by practice of the inventive concepts.

According to one aspect of the invention, a display apparatus includes: a substrate; a first layer disposed on the substrate and including an organic light-emitting device; a second layer disposed on the first layer and including an inorganic material; a capping layer disposed on the second layer, and a reflection adjusting layer disposed on the capping layer.

The inorganic material may have a refractive index of about 1 or more.

The inorganic material may have an absorption coefficient of about 0.5 or more.

The inorganic material may include ytterbium, bismuth, cobalt, molybdenum, titanium, zirconium, aluminum, chromium, niobium, platinum, tungsten, indium, tin, iron, nickel, tantalum, manganese, zinc, germanium, or a combination thereof.

The second layer may be made by thermally depositing the inorganic material.

The second layer may have a thickness from about 0.1 nm to about 50 nm.

The third layer may include a dye, a pigment, or a combination thereof.

The third layer may have a maximum absorption wavelength in a first region of about 480 nm to about 510 nm or a second region of about 580 nm to about 610 nm.

The third layer may include a compound including an oxazine moiety, a compound including a cyanine moiety, a compound including a tetraazoporphine moiety, or a compound including a squarylium moiety.

The capping layer may include an organic capping layer including an organic material, an inorganic capping layer including an inorganic material, or a composite capping layer including an organic material and an inorganic material.

The capping layer may have a thickness from about 1 nm to about 200 nm.

An input sensing layer may be between the capping layer and the reflection adjusting layer, and the input sensing layer may include a touch electrode layer.

The display apparatus may further include an encapsulation layer on the capping layer.

The encapsulation layer may include a sealing portion and an encapsulation substrate.

The encapsulation layer may include an encapsulation portion and further including an input sensing member between the encapsulation portion and the reflection adjusting layer.

The layer may include a display device layer, including an organic light-emitting device, and the organic light-emitting device may include: a pixel electrode; an interlayer disposed on the pixel electrode and including an emission layer; and an opposite electrode disposed on the interlayer.

The display apparatus may exclude a polarizing plate.

The display apparatus may exclude a color conversion member or a wavelength conversion member.

The display apparatus may further include a thin-film transistor, wherein the thin-film transistor may be electrically connected to the organic light-emitting device.

The thin-film transistor may include a semiconductor layer and a gate electrode overlapping a channel area of the semiconductor layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
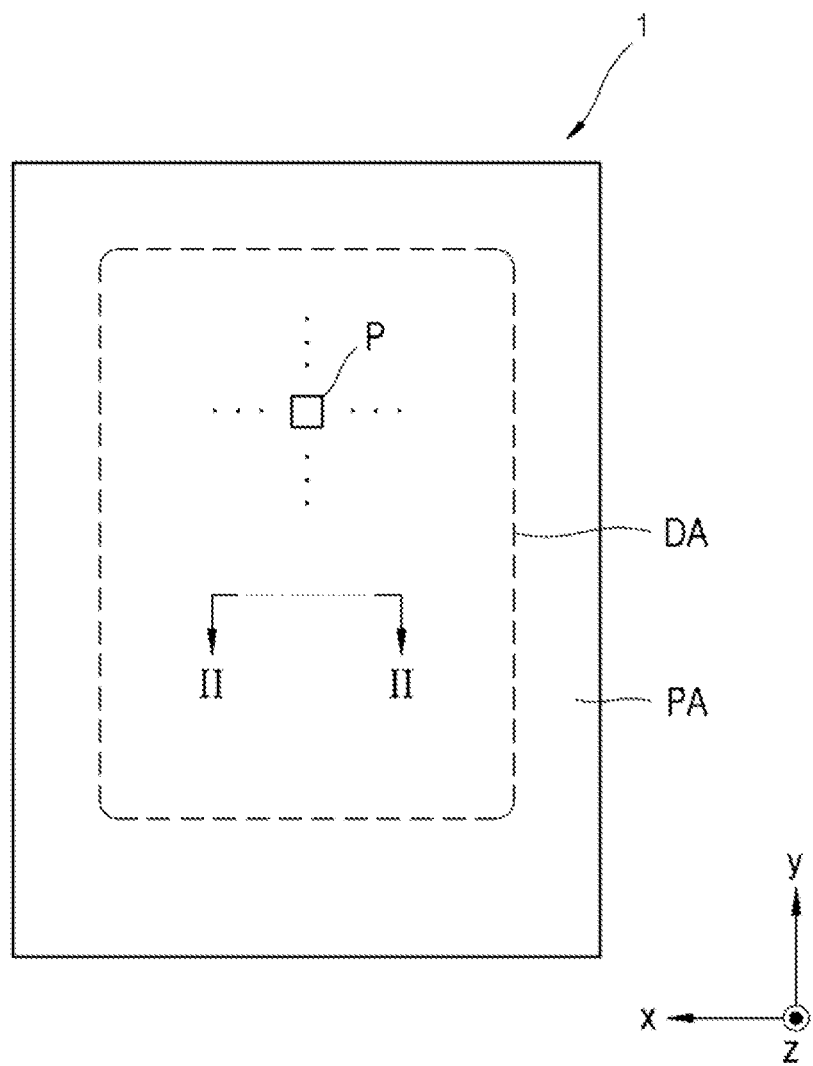
FIG. 1 is a schematic plan view of an embodiment of a display apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements, and those components that are the same or are in correspondence with each other have the same reference numeral regardless of the figure number, and redundant explanations are omitted to avoid redundancy.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic plan view of an embodiment of a display apparatus constructed according to the principles of the invention.

Referring to FIG. 1, a display apparatus 1 includes a display area DA and a peripheral area PA. The display area DA may have pixels P each including a display element arranged therein, and may be configured to provide an image.

The peripheral area PA is a non-display area in which display elements are not located, and may not be configured to provide an image. The peripheral area PA may include, for example, a driver such as a scan driver and data driver for transmitting an electrical signal and power to be applied to the pixels P of the display area DA, a signal line such as a scan line and a data line, and power lines for providing power such as a driving voltage (ELVDD) and a common voltage (ELVSS).

FIG. 1 shows the display apparatus 1 including a substantially flat display surface, but the embodiments are not limited thereto. According to an embodiment, the display apparatus 1 may include a three-dimensional display surface or a substantially curved display surface.

According to an embodiment, when the display apparatus 1 includes a three-dimensional display surface, the display apparatus 1 includes a plurality of display areas indicating different directions, and for example, may include a generally polygonal columnar display surface. According to an embodiment, when the display apparatus 1 includes a substantially curved display surface, the display apparatus 1 may be implemented in various forms such as generally flexible, generally foldable, and generally rollable display apparatuses.

FIG. 1 shows a case in which the display area DA of the display apparatus 1 has a generally angular, square-shaped corner, but, according to an embodiment, a shape of the display area DA may be generally circular, generally oval, or generally polygonal such as being generally triangular or generally pentagonal. According to an embodiment, the display area DA may have generally polygonal shape with generally rounded corners.

According to an embodiment, the display element may be an organic light-emitting device (OLED). Hereinafter, although an organic light-emitting display apparatus is shown as an example of the display apparatus, embodiments of the invention are not limited thereto. In an embodiment, the display apparatus 1 of may be an inorganic light-emitting display apparatus (an inorganic light-emitting display or an inorganic EL (electroluminescence) display apparatus), or may be a display apparatus such as a quantum dot light-emitting display apparatus. In an embodiment, an emission layer of a display element included in the display apparatus 1 may include an organic material, may include an inorganic material, may include a quantum dot, may include an organic material and a quantum dot, or may include an inorganic material and a quantum dot.

Figure 2A:
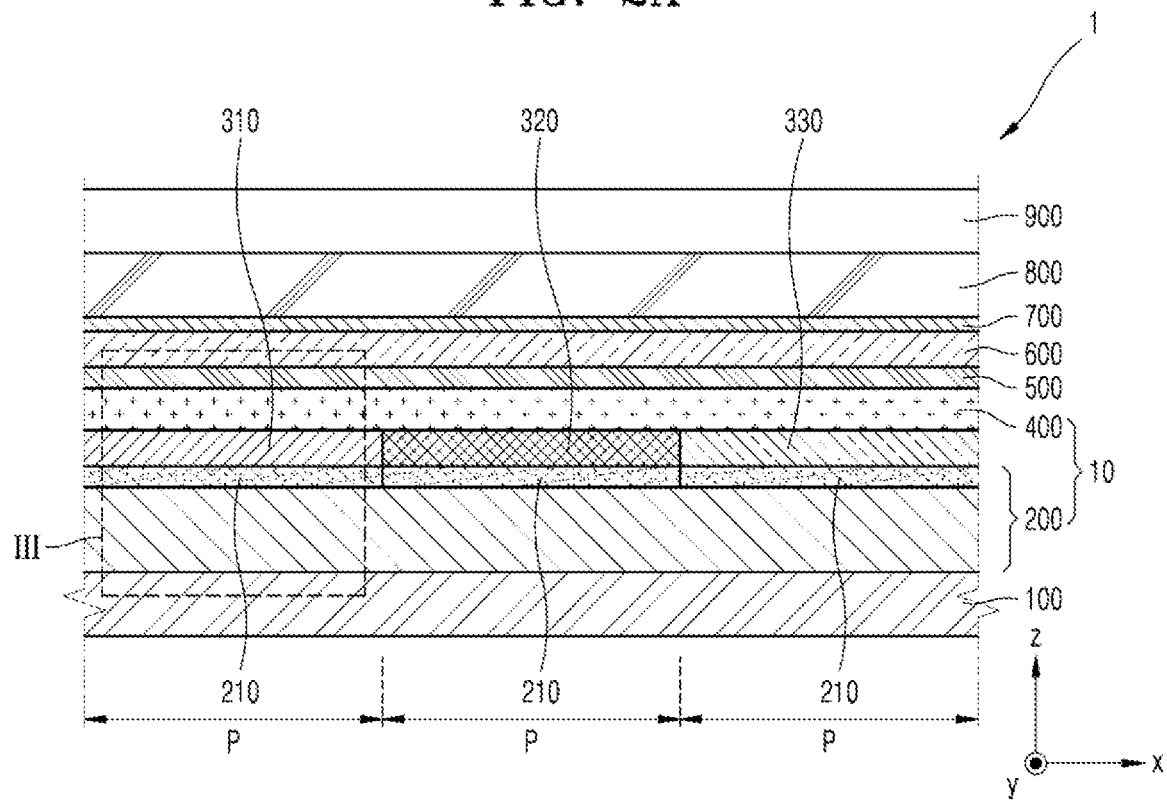
FIG. 2A is a schematic cross-sectional view taken along line II-II of FIG. 1 depicting an embodiment of the invention.
Figure 2B:
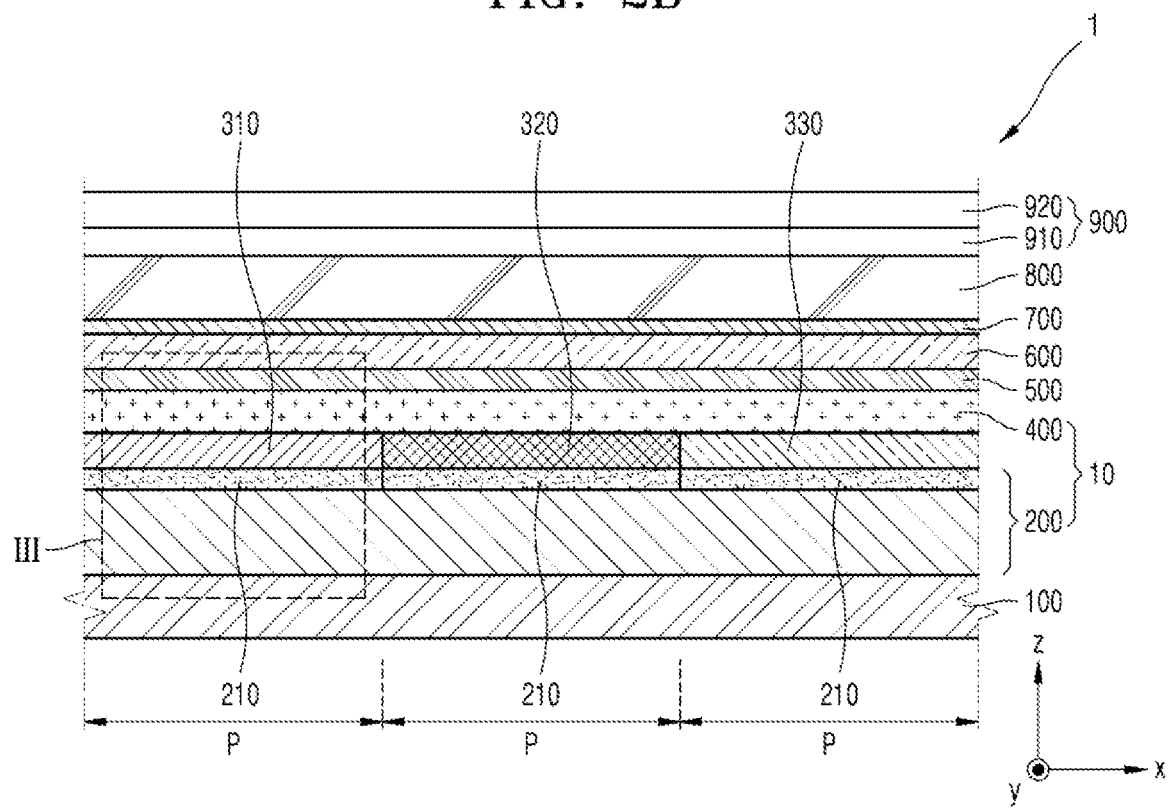
FIG. 2B is a schematic cross-sectional view taken along line II-II of FIG. 1 depicting another embodiment of the invention.
Figure 3A:
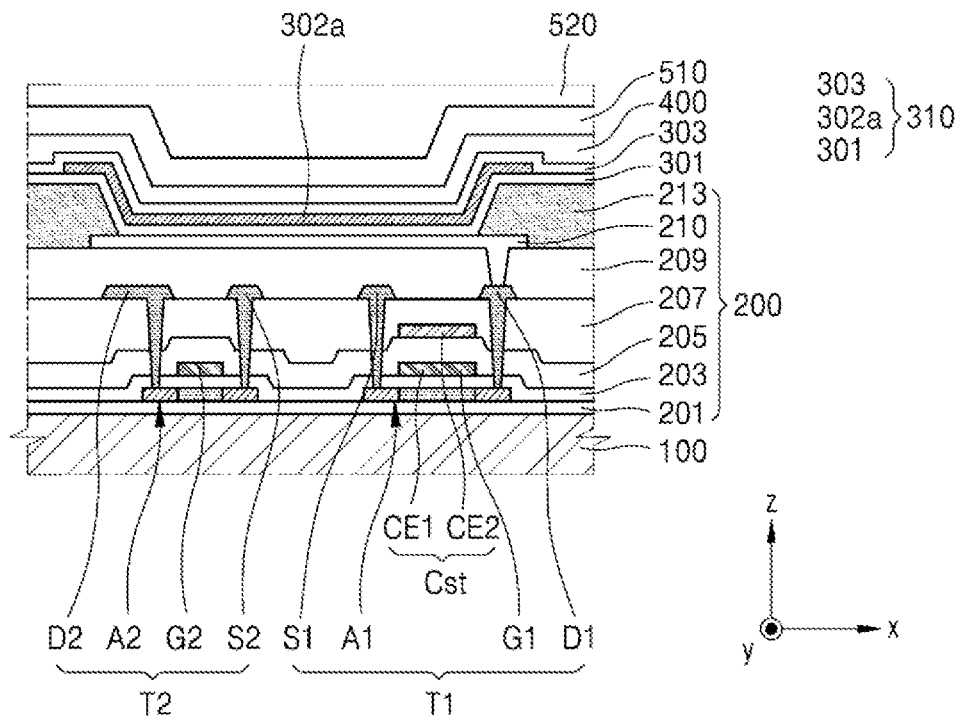
FIG. 3A is a schematic cross-sectional view of an embodiment of a display device layer, an interlayer, and an opposite electrode of an area IIIA of FIG. 2A.
Figure 3B:
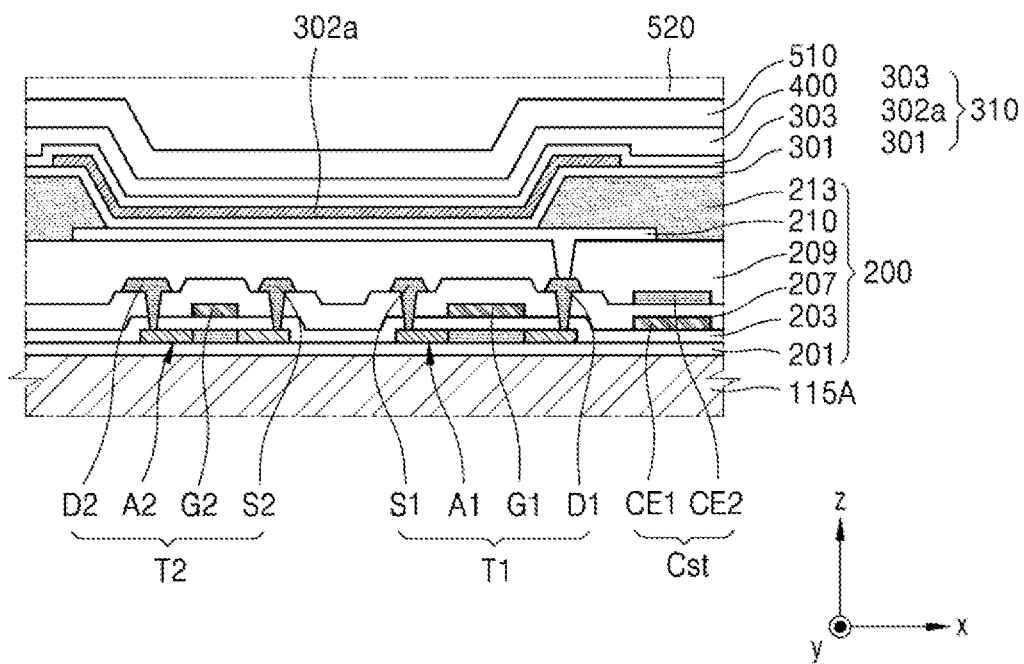
FIG. 3B is a schematic cross-sectional view of an embodiment of a display device layer, an interlayer, and an opposite electrode of an area IIIB of FIG. 2B.

FIG. 2A is a schematic cross-sectional view taken along line II-II of FIG. 1 depicting an embodiment of the invention. FIG. 2B is a schematic cross-sectional view taken along line II-II of FIG. 1 depicting another embodiment of the invention. FIG. 3A is a schematic cross-sectional view of an embodiment of a display device layer, an interlayer, and an opposite electrode of an area IIIA of FIG. 2A. FIG. 3B is a schematic cross-sectional view of an embodiment of a display device layer, an interlayer, and an opposite electrode of an area IIIB of FIG. 2B.

Referring to FIGS. 2A and 2B, the display apparatus 1 includes a substrate 100. As the substrate 100, a glass substrate or a plastic substrate may be used. In one or more embodiments, the substrate 100 may be a flexible substrate, and may include plastics with excellent heat resistance and durability, such as a polyimide (PI), a polyethylene terephthalate (PET), a polycarbonate (PC), a polyethylene naphthalate (PEN), a polyarylate (PAR), a polyetherimide, or any combinations thereof. According to an embodiment, the substrate 100 may include a polyimide (PI), a polyethersulfone (PES), a polyacrylate (PAR), a polyether imide (PEI), a polyethylene naphthalate (PEN), a polyethylene terephthalate (PET), a polyphenylene sulfide (PPS), a polyarylate, a polycarbonate (PC), a cellulose triacetate (TAC), a cellulose acetate propionate (CAP), a cyclic olefin polymer, a cyclic olefin copolymer, or the like.

A layer in the form of a display device layer 10 is located on the substrate 100. The display device layer 10 includes a circuit layer 200, interlayers 310, 320, and 330, and an opposite electrode 400. The circuit layer 200 includes a pixel electrode 210 formed for each pixel P, and the interlayers 310, 320, and 330 and the opposite electrode 400 are located on the pixel electrode 210.

The interlayers 310, 320, and 330 includes an emission layer emitting different colors of light for each pixel P. In an embodiment, an interlayer 310 (hereinafter, referred to as a first interlayer) includes an emission layer including an organic material emitting red light, an interlayer 320 (hereinafter, referred to as a second interlayer) includes an emission layer including an organic material emitting green light, and an interlayer 330 (hereinafter, referred to as a third interlayer) includes an emission layer including an organic material emitting blue light. The first to third interlayers 310, 320, and 330 may each further include at least one of a hole transport layer, a hole injection layer, an electron transport layer, and an electron injection layer, in addition to the emission layer emitting light.

The pixel electrode 210, the first interlayer 310, and the opposite electrode 400 form one organic light-emitting device, and excitons formed by a combination of holes and electrons respectively provided from the pixel electrode 210 and the opposite electrode 400 in the first interlayer 310, for example, an emission layer, transition from an excited state to a ground state, thereby generating light. Likewise, the pixel electrode 210, the second interlayer 320, and the opposite electrode 400 constitute one organic light-emitting device, and the pixel electrode 210, the third interlayer 330, and the opposite electrode 400 constitute one organic light-emitting device and each emit light. As described above, the organic light-emitting devices may each emit, for example, red, green, or blue light.

The circuit layer 200 includes a circuit applying a signal and a voltage to the organic light-emitting devices described above. The circuit layer 200 is the same as described in connection with FIGS. 3A and 3B.

Referring to FIG. 3A, the circuit layer 200 may include a driving thin-film transistor T1, a switching thin-film transistor T2, a storage capacitor Cst, and the pixel electrode 210 electrically connected to the driving thin-film transistor T1, the switching thin-film transistor T2, and the storage capacitor Cst.

The driving thin-film transistor T1 may include a driving semiconductor layer A1, a driving gate electrode G1, a driving source electrode S1, and a driving drain electrode D1, the switching thin-film transistor T2 may include a switching semiconductor layer A2, a switching gate electrode G2, a switching source electrode S2, and a switching drain electrode D2, and the storage capacitor Cst may include a first storage capacitor plate CE1 and a second storage capacitor plate CE2.

A buffer layer 201 is located between the substrate 100 and the driving semiconductor layer A1 and switching semiconductor layer A2, a gate insulating layer 203 is located between the driving semiconductor layer A1 and switching semiconductor layer A2 and the driving gate electrode G1 and switching gate electrode G2, a dielectric layer 205 is located between the first and second storage capacitor plates CE1 and CE2, an insulating interlayer 207 is located between the driving gate electrode G1 and switching gate electrode G2 and the driving source electrode S1, driving drain electrode D1, switching source electrode S2, and switching drain electrode D2, and an insulating layer 209 is located under the pixel electrode 210.

The buffer layer 201 and the gate insulating layer 203 may be a single layer or multilayer including an inorganic material such as a silicon nitride ($SiN_x$) and/or a silicon oxide ($SiO_x$). The dielectric layer 205 and the insulating interlayer 207 may be a single layer or multilayer including an inorganic material such as $SiO_x$, $SiN_x$, and/or an aluminum oxide ($Al_2O_3$). The insulating layer 209 may include an organic material including general-purpose polymer such as a polymethylmethacrylate (PMMA) or a polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof, but the embodiments are not limited thereto.

The pixel electrode 210 is located on the insulating layer 209, which is a planarization layer. The pixel electrode 210 may be a transparent conductive oxide (TCO) layer. In an embodiment, the pixel electrode 210 may be a metal thin film including silver (Ag) or a Ag alloy, or may be a multilayer of a TCO layer formed on the metal thin film. In an embodiment, the pixel electrode 210 may be three layers in which an indium tin oxide (ITO)/Ag/ITO are sequentially stacked.

A pixel-defining film 213 exposes the pixel electrode 210 while covering an edge of the pixel electrode 210. The pixel-defining film 213 may include an organic insulating material and an inorganic insulating material, may include only an organic insulating material, or may include only an inorganic insulating material.

An emission layer 302a of the first interlayer 310 include an organic material emitting red light, and is located to overlap the pixel electrode 210 exposed via the pixel-defining film 213. A first intermediate functional layer 301 and a second intermediate functional layer 303 may be located under and/or on the emission layer 302a.

According to an embodiment, the pixel-defining film 213 may include a black material or a material of which an optical density (OD) is about 1.

The first intermediate functional layer 301 is located between the pixel electrode 210 and the emission layer 302a. The first intermediate functional layer 301 may include a hole transport layer and a hole injection layer. The second intermediate functional layer 303 is located between the emission layer 302a and the opposite electrode 400. The second intermediate functional layer 303 may include an electron transport layer and an electron injection layer.

The emission layer 302a and the first and second intermediate functional layers 301 and 303 may include a small-molecule organic material or a polymer material. When a small-molecule organic material is included, various organic materials as well as copper phthalocyanine (CuPc), N,N'-Di(naphthalene-1-yl)-N,N'-diphenyl-benzidine (NPB), tris-8-hydroxyquinoline aluminum ($Alq_3$), and the like may be utilized. When a polymer material is included, the first intermediate functional layer 301 may include a hole transport layer. The hole transport layer may include poly(3,4-ethylenedioxythiophene) (PEDOT) and the emission layer 302a may include a polymer material such as a polyfluorene-based material, but they are merely examples, and embodiments are not limited thereto.

The opposite electrode 400 may be integrally formed to entirely cover the substrate 100. The opposite electrode 400 may be a semi-transmissive metal thin film including at least one of Li, Ca, LiF/Ca, LiF/Al, Al, Mg, Ag, and an alloy of Ag and Mg, each having a low work function. In an embodiment, the opposite electrode 400 may include the semi-transmissive metal thin film and a TCO film, such as an ITO, an indium zinc oxide (IZO), a ZnO, an $In_2O_3$, an indium gallium oxide (IGO), or an aluminum zinc oxide (AZO), located on the semi-transmissive metal thin film.

Referring to FIG. 3B, the storage capacitor Cst may be located to overlap the driving thin-film transistor T1. In an embodiment, the first storage capacitor plate CE1 and the driving gate electrode G1 may be located on the same layer, and the storage capacitor Cst may overlap the driving thin-film transistor T1.

FIG. 3A shows a structure in which the storage capacitor Cst of the circuit layer 200 is located at a position separate from the driving thin-film transistor T1 and the switching thin-film transistor T2, but the embodiments are not limited thereto.

According to the embodiments described with reference to FIGS. 3A and 3B, the driving gate electrode G1 and switching gate electrode G2 of the driving thin-film transistor T1 and switching thin-film transistor T2 are located on the driving semiconductor layer A1 and switching semiconductor layer A2, but embodiments are not limited thereto. In an alternative embodiment, the driving gate electrode G1 and switching gate electrode G2 may be located under the driving semiconductor layer A1 and switching semiconductor layer A2, respectively. According to positions of the driving gate electrode G1 and switching gate electrode G2, in some embodiments, the driving semiconductor layer A1 and switching semiconductor layer A2 may be directly located on the buffer layer 201, and in some embodiments, the driving gate electrode G1 and switching gate electrode G2 may be directly located on the buffer layer 201. Although a pixel P including the first interlayer 310 has been mainly described with reference to FIGS. 3A and 3B, and a pixel P including the second and third interlayers 320 and 330 may have substantially the same structure as described above, a redundant description thereof will be omitted.

Referring back to FIGS. 2A and 2B, a low-reflection inorganic layer 500 including an inorganic material is located on the display device layer 10. The low-reflection inorganic layer 500 may also be referred to as inorganic absorption layer. According to an embodiment, the inorganic material included in the low-reflection inorganic layer 500 may have a refractive index of about 1 or more. According to an embodiment, the inorganic material included in the low-reflection inorganic layer 500 may have an absorption coefficient of about 0.5 or more. Correspondingly, the low-reflection inorganic layer 500 may have at least one of a refractive index of about 1 or more and an absorption coefficient of about 0.5 or more.

According to an embodiment, the inorganic material may include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or a combination thereof. According to an embodiment, the low-reflection inorganic layer 500 may be formed by thermally depositing the inorganic material.

Light incident from the outside to the inside of the display apparatus 1 may be reflected by layers of the display apparatus 1, and thus may be visually recognized to the outside or cause deterioration of display quality or the like. In display apparatus 1, the low-reflection inorganic layer 500 may absorb light incident to the inside of the display apparatus 1 and, not wanting to be bound by theory, induce destructive interference between opening metals, and thus light reflected by an external light source may be effectively reduced or blocked while reduction in light emitted from the inside of the display apparatus 1 is minimized. Accordingly, the display quality and visibility of the display apparatus 1 may be improved. Also, the display apparatus 1 including the low-reflection inorganic layer 500 has low consumption power and excellent light efficiency, and has excellent spectral characteristics due to a decrease in color coordinate changes according to a viewing angle.

According to an embodiment, the thickness of the low-reflection inorganic layer 500 may be from about 0.1 nanometer (nm) to about 50 nm; preferably from about 0.5 nm to about 30 nm; or optimally from about 1 nm to about 20 nm. When the thickness of the low-reflection inorganic layer 500 is within the range, an external light reflectance of the display apparatus 1 is reduced, and thus visibility may be reduced, light efficiency is excellent, and power consumption and a panel thickness of the display apparatus 1 may be reduced.

A capping layer 600 is located on the low-reflection inorganic layer 500. The capping layer 600 may increase external luminescence efficiency of an organic light-emitting device according to, although not wanting to be bound by theory, the principle of constructive interference. Because the capping layer 600 is located on the low-reflection inorganic layer 500 as described above, color coordinate changes according to the viewing angle of the display panel is reduced, and thus excellent spectral characteristics may be exhibited. Generally, when a low-reflection inorganic layer is located on a capping layer, a phenomenon in which an inorganic layer is oxidized by moisture and oxygen may occur, whereas a display apparatus 1 includes a low-reflection inorganic layer located under a capping layer, and thus such phenomenon may be suppressed and lifespan characteristics of the display apparatus may be improved. According to an embodiment, the capping layer 600 may include a material having a refractive index (at 589 nm) of about 1.6 or more.

According to an embodiment, the capping layer 600 may be an organic capping layer including an organic material, an inorganic capping layer including an inorganic material, or a composite capping layer including an organic material and an inorganic material. In an embodiment, the capping layer 600 may include carbocyclic compounds, heterocyclic compounds, amine group-containing compounds, porphyrin derivatives, phthalocyanine derivatives, naphthalocyanine derivatives, alkali metal complexes, alkaline earth-metal complexes, or any combinations thereof. The carbocyclic compound, the heterocyclic compound, and the amine group-containing compound may be optionally substituted with a substituent containing O, N, S, Se, Si, F, Cl, Br, I, or any combinations thereof.

According to an embodiment, the capping layer 600 may include one of Compounds HT28 to HT33, one of Compounds CP1 to CP6, bis(naphthalen-1-yl)-N,N'-bis(phenyl)benzidine (β-NPB), or any compounds thereof:

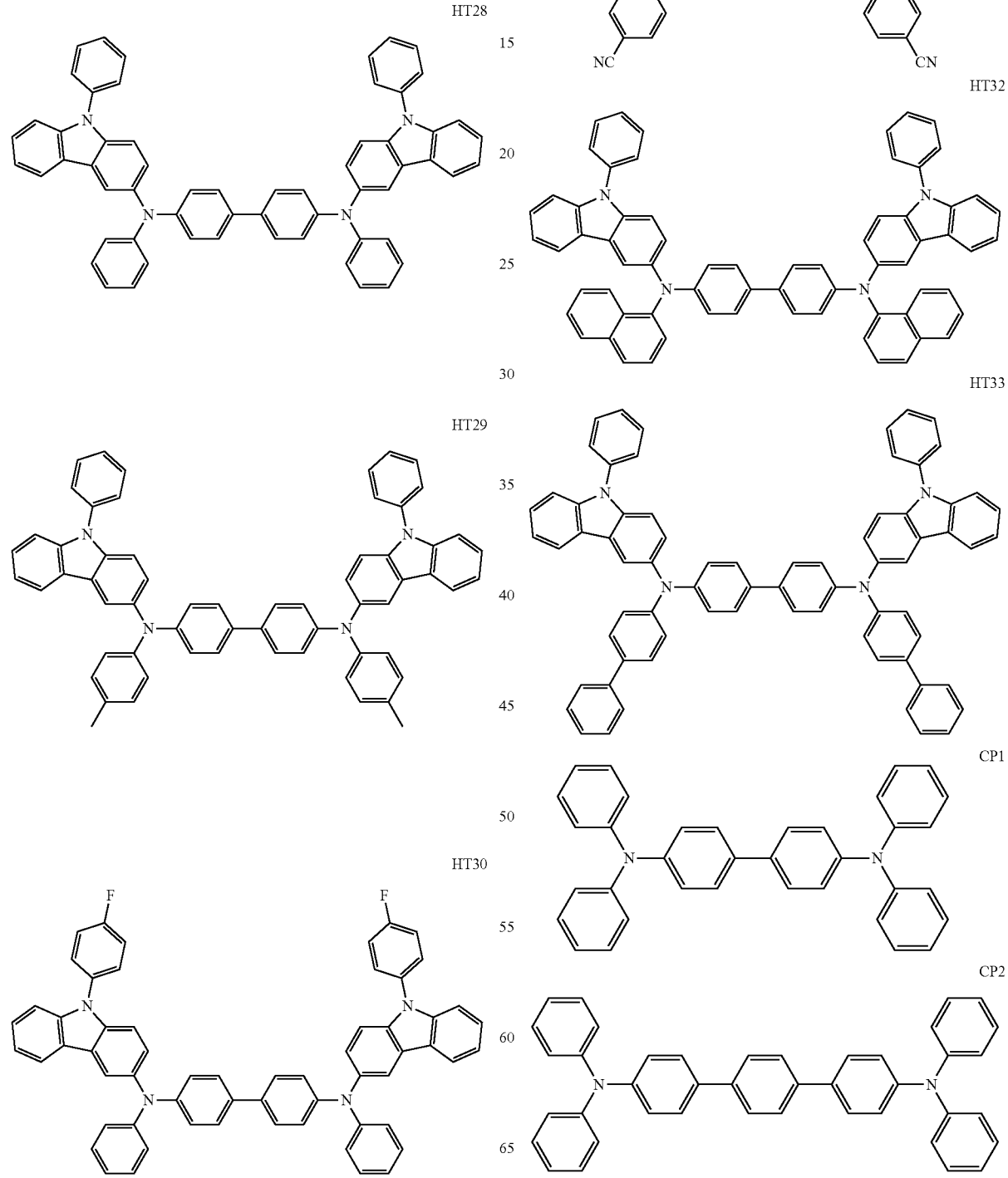

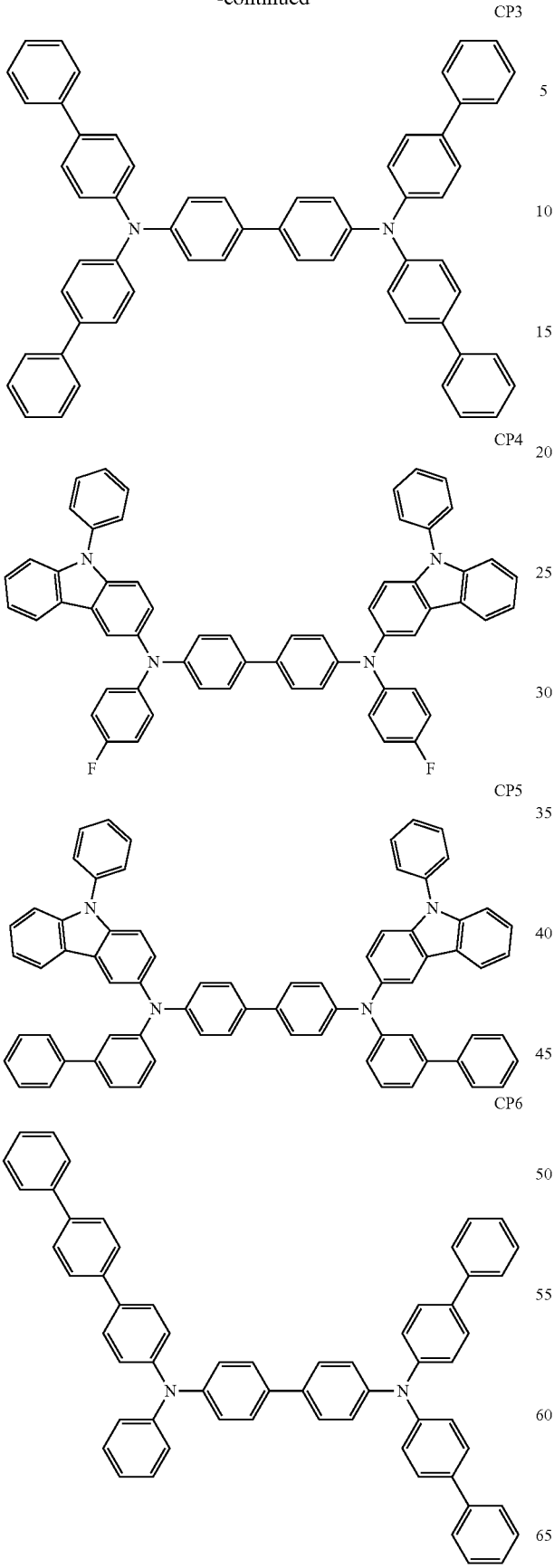

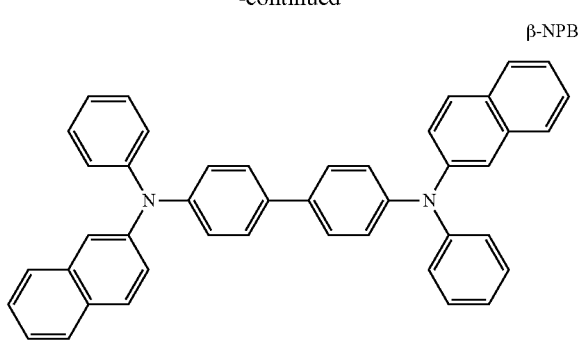

According to an embodiment, the thickness of the capping layer 600 may be from about 1 nm to about 200 nm, preferably from about 5 nm to about 150 nm, or optimally from about 10 nm to about 100 nm.

A reflection adjusting layer 900 is located on the capping layer 600. According to an embodiment, the reflection adjusting layer 900 may include a dye, a pigment, or a combination thereof. According to an embodiment, the reflection adjusting layer 900 may include a compound including an oxazine moiety in the form of an oxazine-based compound (e.g., the following Formula 4), a compound including a cyanine moiety in the form of a cyanine-based compound (e.g., the following Formula 2), a compound including a tetraazoporphine moiety in the form of a tetraazoporphine (e.g. tetraazaporphyrin)-based compound (e.g., the following Formula 1), or a compound including a squarylium moiety in the form of a squarylium-based compound (e.g., the following Formula 3).

In an embodiment, the reflection adjusting layer 900 may include a compound represented by any one of Formulae 1 to 4:

Formula 1

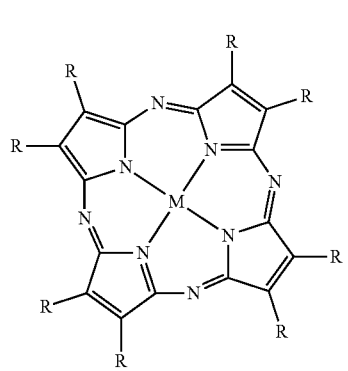

Formula 2

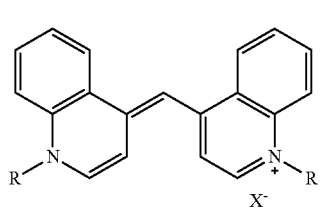

-continued

Formula 3

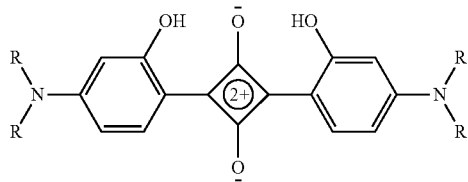

Formula 4

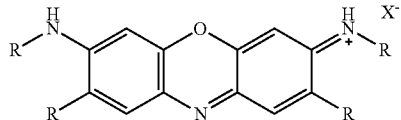

wherein, in Formulae 1 to 4,

M may be a metal,

X– is a monovalent anion,

R(s) may be identical to or different from each other, and may be: deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combinations thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combinations thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

The variables $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combinations thereof.

According to an embodiment, the reflection adjusting layer 900 may be a multi-layered structure including an adhesive layer 910 and an UV protective layer 920, and at least one of the adhesive layer 910 and the UV protective layer 920 may include the dye, the pigment, or a combination thereof. According to an embodiment, the adhesive layer 910 may include an adhesive material, and may further include the dye, the pigment, or a combination thereof. The adhesive material may include, for example, an optical clear adhesive (OCA) and a pressure sensitive adhesive (PSA). According to an embodiment, the UV protective layer 920 may include an UV absorber, and may further include the dye, the pigment, or a combination thereof. The UV absorber may include, for example, a benzotriazole-based compound, a benzophenone-based compound, a triazine-based compound, or an oxanilide-based compound.

According to an embodiment, the UV absorber may include a compound represented by any one of Formulae 11 to 14.

Formula 11

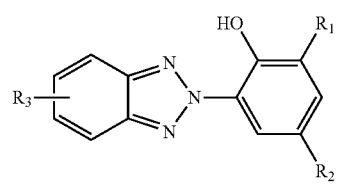

Formula 12

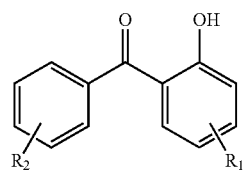

Formula 13

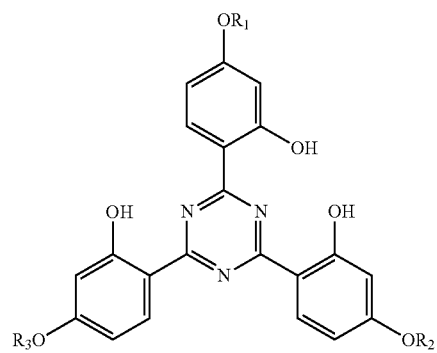

Formula 14

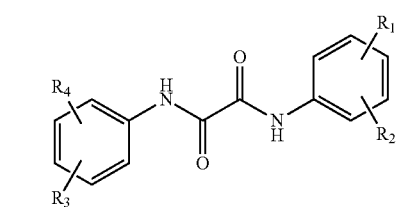

wherein, in Formulae 11 to 14, $R_1$ to $R_4$ may each independently be: hydrogen, deuterium (-D), —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combinations thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combinations thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_{11}$ to $Q_{13}$, $Q_{21}$ to $Q_{23}$, and $Q_{31}$ to $Q_{33}$ are each the same as described herein.

In an embodiment, a compound represented by Formula 12 may be 2-hydroxybenzophenone.

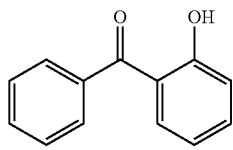 [SMILES: O=C(c1ccccc1)c1ccccc1O]

In an embodiment, a compound represented by Formula 13 may be a triazine-based compound.

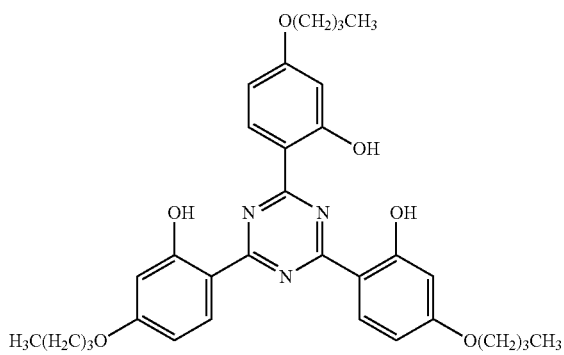

According to an embodiment, a maximum absorption wavelength of the reflection adjusting layer 900 may be included in a first wavelength region of about 480 nm to about 510 nm or a second wavelength region of about 580 nm to about 610 nm. That is, the reflection adjusting layer 900 may absorb light of a wavelength out of a red, green, or blue emission wavelength range of an organic light-emitting device, and thus the display apparatus 1 having excellent light efficiency may be embodied.

According to an embodiment, a reflectance measured in a specular component included (SCI) mode on a surface of the reflection adjusting layer 900 may be about 20% or less. That is, the reflection adjusting layer 900 may have improved visibility by absorbing external light reflection of the display apparatus 1. According to an embodiment, an encapsulation portion 700 may be located between the capping layer 600 and the reflection adjusting layer 900. The encapsulation portion 700 is located on the display device layer 10, and thus may protect an organic light-emitting device 50 from moisture and oxygen. According to an embodiment, the encapsulation portion 700 may include a sealing portion and an encapsulation substrate.

According to an embodiment, the capping layer 600 and the encapsulation substrate are spaced apart from each other, and at least a portion of space between the capping layer 600 and the encapsulation substrate may be sealed by the sealing portion. According to an embodiment, the encapsulation substrate may be located to face the substrate 100. In such a case, the encapsulation substrate may include a material that is the same as or similar to that of the substrate 100. In an embodiment, the encapsulation substrate may include a glass or a plastic. In this regard, the encapsulation substrate may include at least one layer including at least one resin.

According to an embodiment, an input sensing member 800 may be located between the encapsulation portion 700 and the reflection adjusting layer 900. The input sensing member 800 may include a touch electrode layer including electrodes which recognizes a touch input.

According to an embodiment, a backing film may be located on a back surface of the substrate 100, for example, an opposite side of the circuit layer 200. The backing film may include a backing protective layer, a black layer, a buffer layer, or a combination thereof, and may be adhered to and located on the back surface of the substrate 100 by using an adhesive, an adhesive tape, or the like. In an embodiment, a backing film is located on a back surface of a substrate, and the backing film may include a backing protective layer including PET, a black layer including a black ink, and a buffer layer including a polymer resin material.

The reflection adjusting layer 900 may prevent a decrease in light efficiency of the display apparatus 1 by optionally absorbing light reflected from the inside of the display apparatus 1 according to a wavelength, and may improve visibility by adjusting a reflective color. An optical functional member may be further located on the reflection adjusting layer 900. In this regard, an adhesive member such as an OCA may be located between the optical functional member and the reflection adjusting layer 900.

The optical functional member may include a plurality of layers having different refractive indices, and/or may include an optical functional layer including a lens. Also, the optical functional member may include a window covering a surface of the display apparatus. The window may be glass. The window may be located by using an adhesive member such as an OCA. According to an embodiment, the display apparatus 1 may not include a polarizing plate.

Compared to the case of using a polarizing plate, the display apparatus 1 including the low-reflection inorganic layer 500 and the reflection adjusting layer 900 has the same or better performance in terms of preventing reflection of external light, and excellent light efficiency by minimizing a decrease in the width of brightness of emitted light.

According to an embodiment, the display apparatus 1 may not include a color conversion member such as a color filter, or a wavelength conversion member. Compared to a case of using a color conversion member or wavelength conversion member, the display apparatus 1 including the low-reflection inorganic layer 500 and the reflection adjusting layer 900 has the same or better performance in terms of preventing reflection of external light. Also, the display apparatus 1 according to an embodiment has excellent light efficiency because brightness of light emitted by optionally absorbing light of a specific wavelength does not decrease.

Also, Applicant discovered that when the color conversion member or the wavelength conversion member is utilized, although not wanting to be bound by theory, a commonly occurring reflective color strip phenomenon occurs, and an organic layer that improves flatness should be additionally applied to offset the phenomenon. Thus, the thickness of a display panel increases, and several inefficiencies may be caused in the process.

The display apparatus 1 according to an embodiment includes the low-reflection inorganic layer 500 and the reflection adjusting layer 900, thereby preventing the occurrence of the reflective color strip phenomenon, and the reflection adjusting layer 900 is the uppermost portion of the display apparatus 1. Thus, a high-quality display apparatus having a low thickness may be embodied. Also, the display apparatus 1 according to an embodiment has the capping layer 600 located on the low-reflection inorganic layer 500 as described above, and thus color coordinate changes according to a viewing angle of a display panel is reduced, and thus excellent spectral characteristics may be exhibited.

According to an embodiment, the first to third interlayers 310, 320, and 330 of each pixel P of the display apparatus 1 may have different thicknesses. The thicknesses of the first to third interlayers 310, 320, and 330 may be determined according to wavelengths of respective light emitted therefrom and refractive indices of the first to third interlayers 310, 320, and 330. Each of the first to third interlayers 310, 320, and 330 may form a microcavity structure along with the opposite electrode 400 to perform a function of anti-reflection of external light. In an embodiment, some of light incident from the outside may be reflected by the opposite electrode 400, and light passing through the opposite electrode 400 may pass through the third interlayer 330 and be reflected by the pixel electrode 210. The light reflected by the opposite electrode 400 and the light reflected by the pixel electrode 210 may undergo destructive interference with each other, and thus light visible to the outside of the display apparatus 1 is reduced, that is, external light reflectance may be reduced.

The external light causes destructive interference due to the microcavity structure, and respective light emitted from the first to third interlayers 310, 320, and 330 causes constructive interference, and thus light efficiency of the display apparatus 1 may be further increased.

Definition of Terms

As used herein, the term "atom" may mean an element or its corresponding radical bonded to one or more other atoms.

The terms "hydrogen" and "deuterium" refer to their respective atoms and corresponding radicals with the deuterium radical abbreviated "-D", and the terms "—F, —Cl, —Br, and —I" are radicals of, respectively, fluorine, chlorine, bromine, and iodine.

As used herein, a substituent for a monovalent group, e.g., alkyl, may also be, independently, a substituent for a corresponding divalent group, e.g., alkylene.

In one or more embodiments, a "low-reflection inorganic layer" may have at least one of a refractive index of about 1 or more and an absorption coefficient of about 0.5 or more.

In one or more embodiments, "reflection adjusting layer" means a layer having a maximum absorption wavelength in the range of about 480 nm to about 510 nm or about 580 nm to about 610 nm or an SCI of about 20% or lower.

The term "$C_3$-$C_{60}$ carbocyclic group" or "$C_1$-$C_{60}$ heterocyclic group" as used herein may refer to a group fused to any cyclic group, a monovalent group, or a polyvalent group (for example, a divalent group, a trivalent group, a tetravalent group, etc.), depending on a structure of a formula in connection with which the term is used. In an embodiment, "a benzene group" may be a benzo group, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, and a monovalent non-aromatic fused heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic fused polycyclic group, and a divalent non-aromatic fused heteropolycyclic group.

The term "$C_1$-$C_{60}$ alkyl group" as used herein refers to a linear or branched aliphatic hydrocarbon monovalent group that has one to sixty carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_3$-$C_{10}$ cycloalkenyl group" used herein refers to a monovalent cyclic group that has three to ten carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having a structure corresponding to the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be fused with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be fused with each other.

The term "monovalent non-aromatic fused polycyclic group" as used herein refers to a monovalent group having two or more rings fused to each other, only carbon atoms (for example, having 8 to 60 carbon atoms) as ring-forming atoms, and non-aromaticity in its molecular structure when considered as a whole. Examples of the monovalent non-aromatic fused polycyclic group include an indenyl group, a fluorenyl group, a spiro-bifluorenyl group, a benzofluorenyl group, an indenophenanthrenyl group, and an indeno anthracenyl group. The term "divalent non-aromatic fused polycyclic group" as used herein refers to a divalent group having a structure corresponding to a monovalent non-aromatic fused polycyclic group.

The term "monovalent non-aromatic fused heteropolycyclic group" as used herein refers to a monovalent group having two or more rings fused to each other, at least one heteroatom other than carbon atoms (for example, having 1 to 60 carbon atoms), as a ring-forming atom, and non-aromaticity in its molecular structure when considered as a whole. Examples of the monovalent non-aromatic fused heteropolycyclic group include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic fused heteropolycyclic group" as used herein refers to a divalent group having a structure corresponding to a monovalent non-aromatic fused heteropolycyclic group.

The term "$C_6$-$C_{60}$ aryloxy group" as used herein indicates —$OA_{102}$ (wherein $A_{102}$ the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "hetero atom" as used herein refers to any atom other than a carbon atom. Examples of the heteroatom include O, S, N, P, Si, B, Ge, Se, or any combination thereof.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group." The "terphenyl group" is a substituted phenyl group having, as a substituent, a $C_6$-$C_{60}$ aryl group substituted with a $C_6$-$C_{60}$ aryl group.

Hereinafter, display apparatuses constructed according to the principles and certain embodiments of the invention will be described in detail with reference to examples.

EXAMPLES

Evaluation Example 1: Evaluation of Reflectance and Efficiency of Display Apparatus A display panel according to an embodiment was prepared as an Example Apparatus 1. The Example Apparatus 1 includes: a low-reflection inorganic layer located on a display device layer and including bismuth as an inorganic material; a capping layer located on the low-reflection inorganic layer and including an acrylate-based compound; and a reflection adjusting layer including a tetraazaporphyrin-based dye absorbing light of a wavelength of 590 nm to 600 nm.

Also, unlike the Example Apparatus 1 including the low-reflection inorganic layer and the reflection adjusting layer, a display panel including a polarizing plate for preventing reflection was prepared as a Comparative Apparatus 1. Otherwise, Comparative Apparatus 1 was prepared in a similar manner as Example Apparatus 1.

Also, unlike the Example Apparatus 1 including the low-reflection inorganic layer and the reflection adjusting layer, a display panel including a color filter for preventing reflection was prepared as a Comparative Apparatus 2. Otherwise, Comparative Apparatus 2 was prepared in a similar manner as Example Apparatus 1.

Reflectance and current efficiency (expressed as percent transmittance) with respect to the Example Apparatus 1 and the Comparative Apparatuses 1 to 2 were measured and are shown in Table 1. The reflectance was measured when light was incident from the outside while each display panel was not being driven. Both reflectance and transmittance were expressed as relative values as percent values in Table 1.

TABLE 1

|  | Example Apparatus 1 (including a low-reflection inorganic layer and a reflection adjusting layer) | Comparative Apparatus 1 (a polarizing plate applied) | Comparative Apparatus 2 (a color filter applied) |
| --- | --- | --- | --- |
| Transmittance (relative value) | 130% | 100% | 130% |
| Reflectance (relative value) | 5.3% | 4.8% | 5.2% |

Table 1 shows that compared to the Comparative Apparatus 1 to which a polarizing plate is applied, the Example Apparatus 1 has significant and unexpectedly excellent transmittance and an equivalent level of reflectance.

Also, four masks in total should be additionally utilized in the Comparative Apparatus 2 to form a red color filter, a green color filter, a blue color filter, and an overcoating layer in a process of forming a color filter, and it may be confirmed that the Example Apparatus 1 may achieve transmittance and reflectance, which are equal to or better than those of the Comparative Apparatus 2 without the process.

Evaluation Example 2: Evaluation of Spectrum of Display Apparatus

Display panels according to an embodiment were prepared as Example Apparatuses 2 to 4. Each of the Example Apparatuses 2 to 4 includes: a low-reflection inorganic layer located on a display device layer and including bismuth as an inorganic material; a capping layer located on the low-reflection inorganic layer and including an acrylate-based compound; and a reflection adjusting layer including a tetraazaporphyrin-based dye absorbing light of a wavelength of 590 nm to 600 nm.

Also, unlike the Example Apparatuses 2 to 4 in which the capping layer is located on the low-reflection inorganic layer, display panels in which the low-reflection inorganic layer is located on the capping layer were prepared as Comparative Apparatuses 3 to 5. Also, a Comparative Apparatus 6 that does not include a low-reflection inorganic layer was prepared. Otherwise, Comparative Apparatuses 3-6 were prepared in a similar manner as Example Apparatuses 2-4.

Thicknesses of the low-reflection inorganic layer and the capping layer of each of the Example Apparatuses 2 to 4 and the Comparative Apparatuses 3 to 5 as well as the thicknesses of the capping layer of the Comparative Apparatus 6 are each the same as described in Table 2.

TABLE 2

|  | Thickness (nm) of low-reflection inorganic layer | Thickness (nm) of capping layer |
| --- | --- | --- |
| Example Apparatus 2 | 15 | 25.6 |
| Example Apparatus 3 | 15 | 38.4 |
| Example Apparatus 4 | 15 | 64.0 |
| Comparative Apparatus 3 | 15 | 25.6 |
| Comparative Apparatus 4 | 15 | 38.4 |
| Comparative Apparatus 5 | 15 | 64.0 |
| Comparative Apparatus 6 | — | 64.0 |

Figure 4:
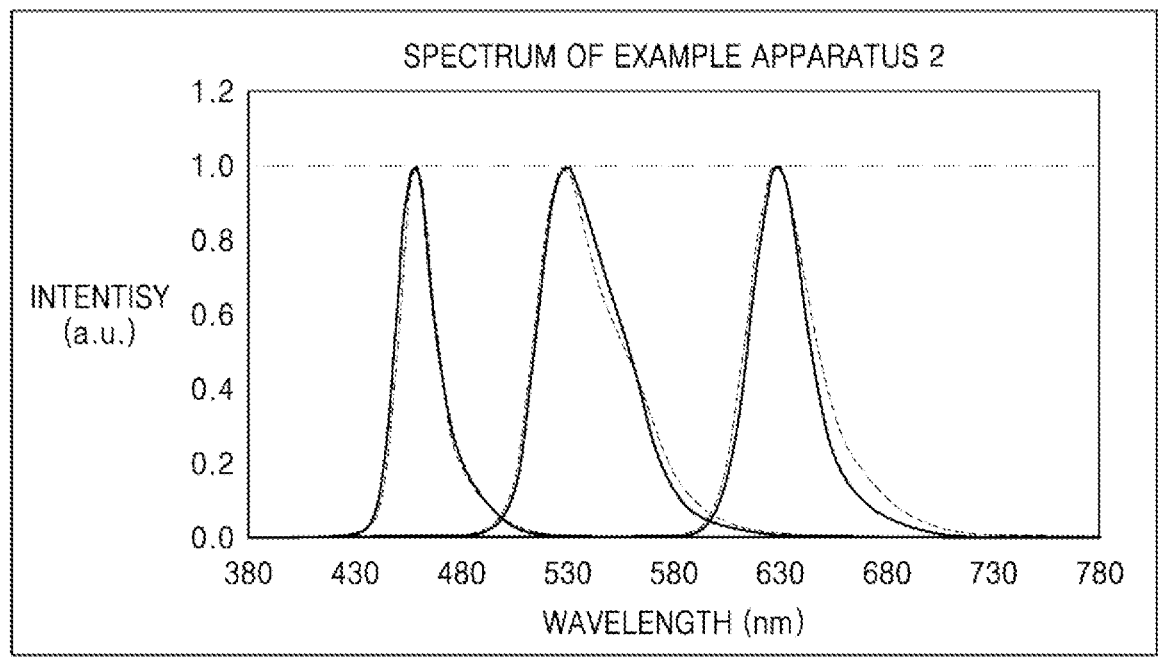
FIGS. 4 to 6 are graphical depictions illustrating an Example made according to an embodiment of the invention and Comparative Example of spectrum versus wavelength.
Figure 4:
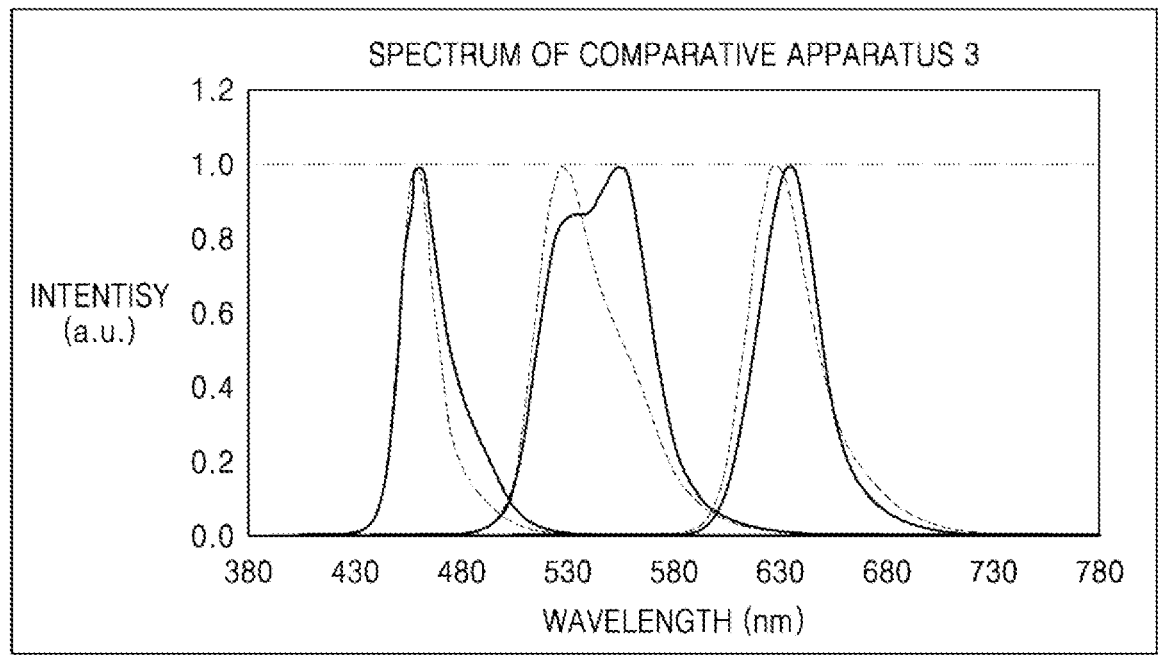
Figure 5:
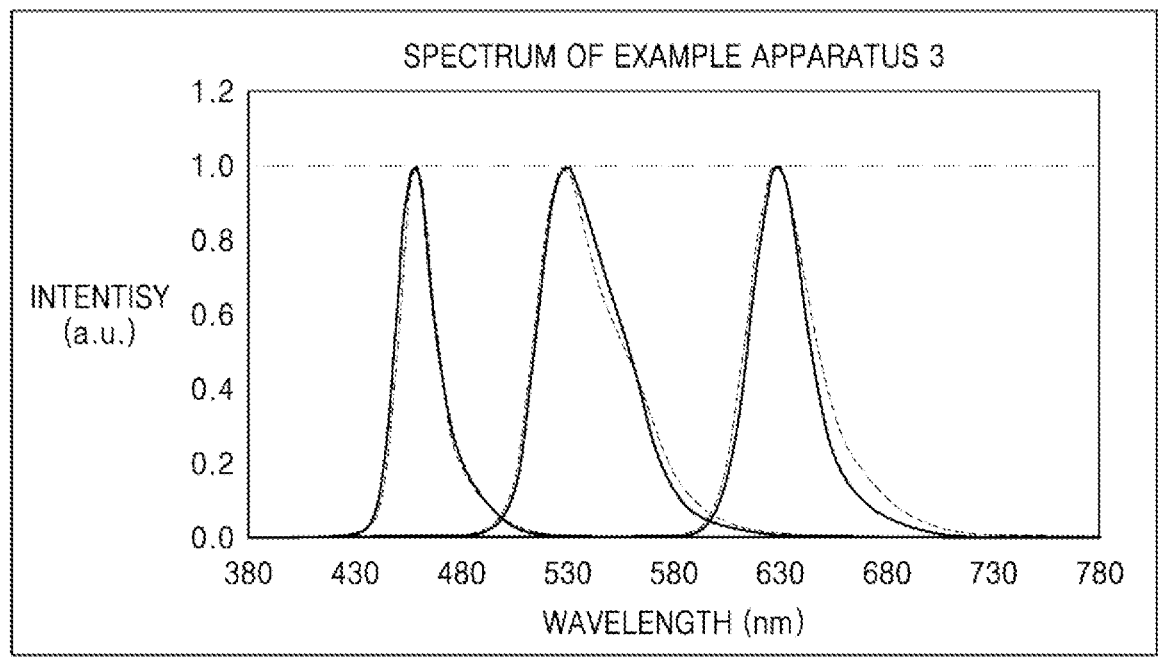
Figure 5:
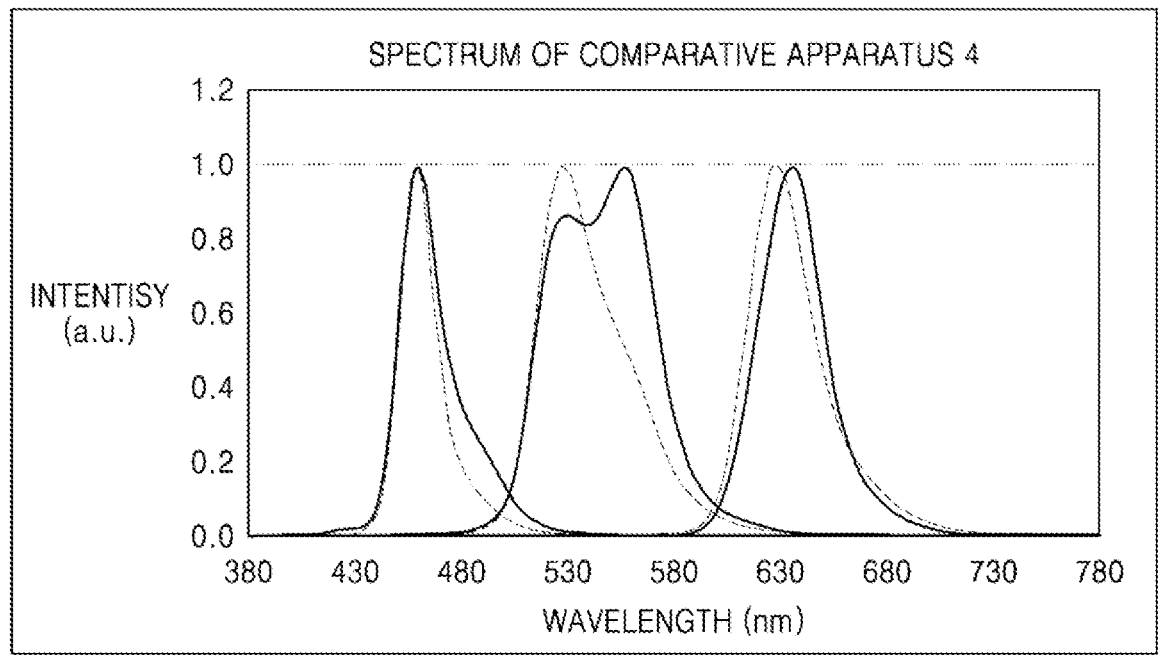
Figure 6:
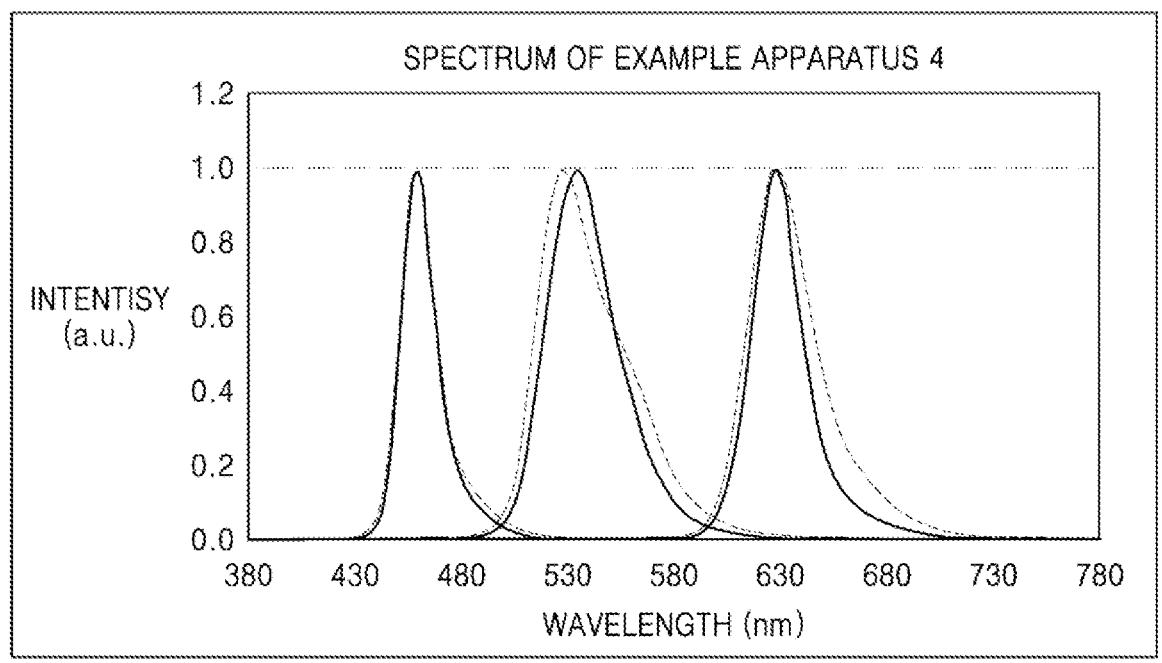
Figure 6:
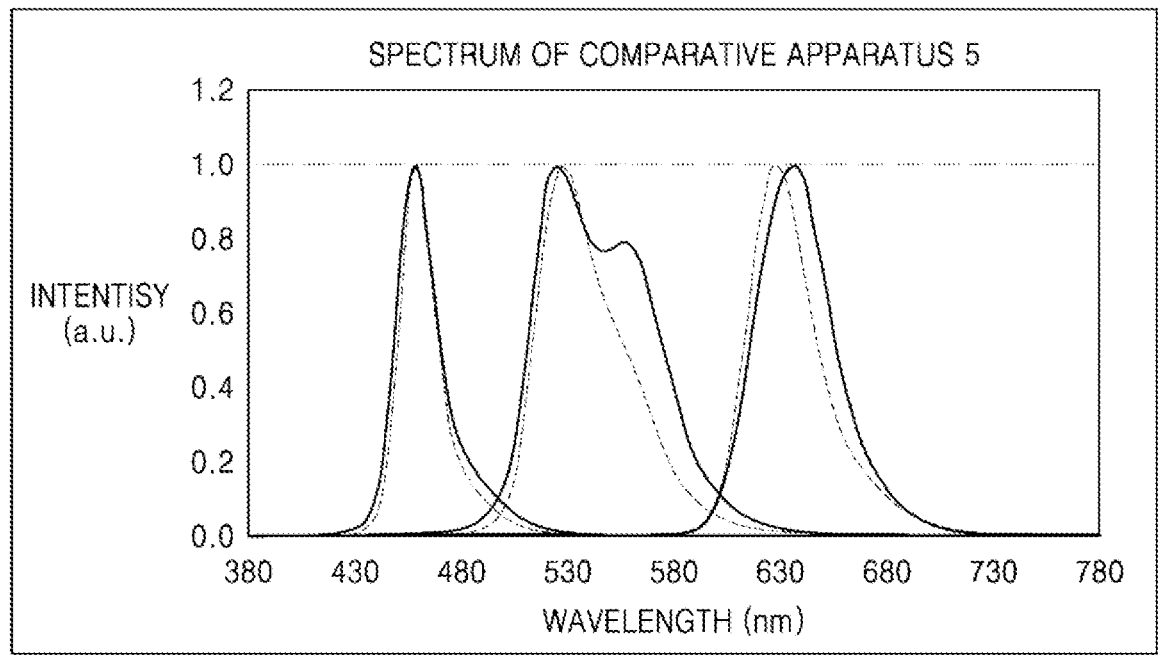

FIGS. 4 to 6 are graphical depictions illustrating an Example made according to an embodiment of the invention and Comparative Example of spectrum versus wavelength.

Spectra for the Example Apparatuses 2 to 4 and the Comparative Apparatuses 3 to 6 were measured, and results are shown in FIGS. 4 to 6. In FIGS. 4 to 6, a dotted line indicates a spectrum of the Comparative Apparatus 6, and solid lines indicate spectra of the Example Apparatuses 2 to 4 and the Comparative Apparatuses 3 to 5, respectively. Referring to FIGS. 4 to 6, in cases of the Example Apparatuses 2 to 4, the spectral difference for the Comparative Apparatus 6 was small compared to the Comparative Apparatuses 3 to 5 including the capping layers of the same thickness. That is, a display panel in which an inorganic absorption layer is located under a capping layer has less change in spectrum due to a configuration of the inorganic absorption layer than a display panel in which an inorganic absorption layer is located on a capping layer, and thus a display panel according to an embodiment has significant and unexpectedly excellent performance in terms of efficiency and decrease in white angle difference (WAD) phenomenon.

Figure 7:
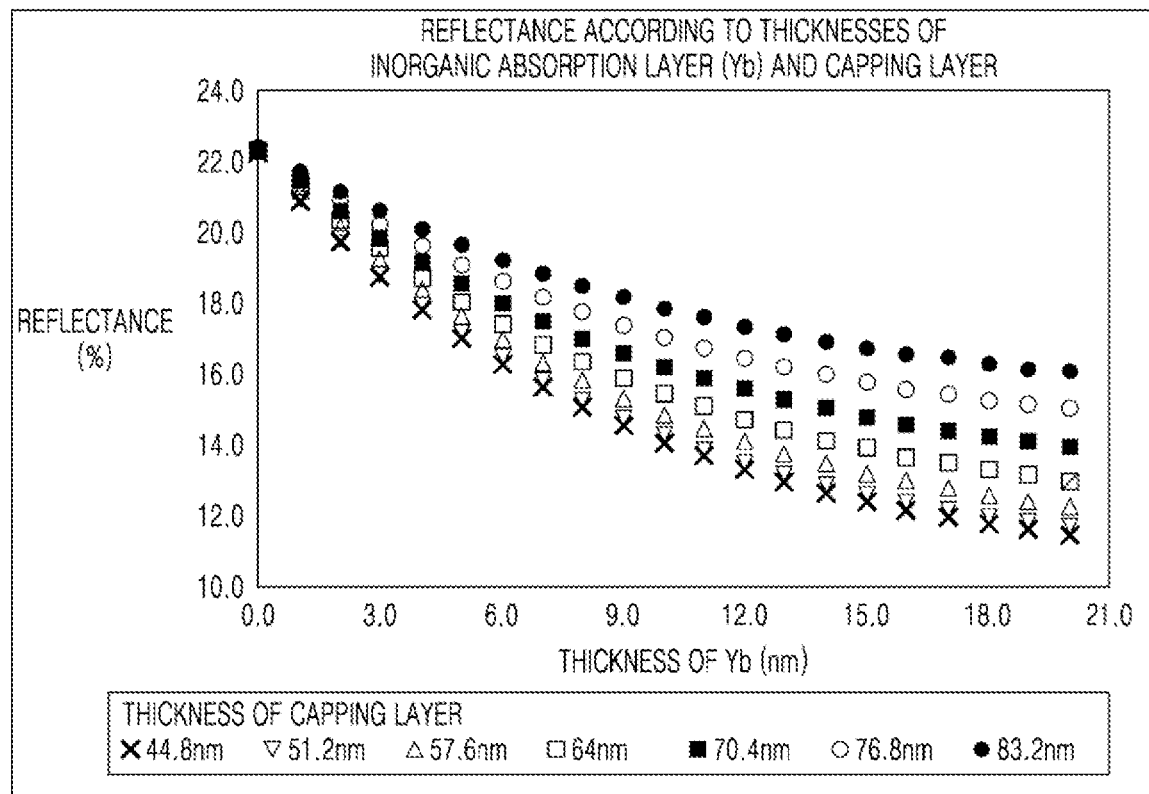
FIG. 7 shows a graphical depiction of several display apparatuses showing reflective percent versus thicknesses of a capping layer and an inorganic absorption layer comprising ytterbium, and a graphical depiction of several display apparatuses showing reflective percent versus thicknesses of a capping layer and an inorganic absorption layer comprising bismuth.
Figure 7:
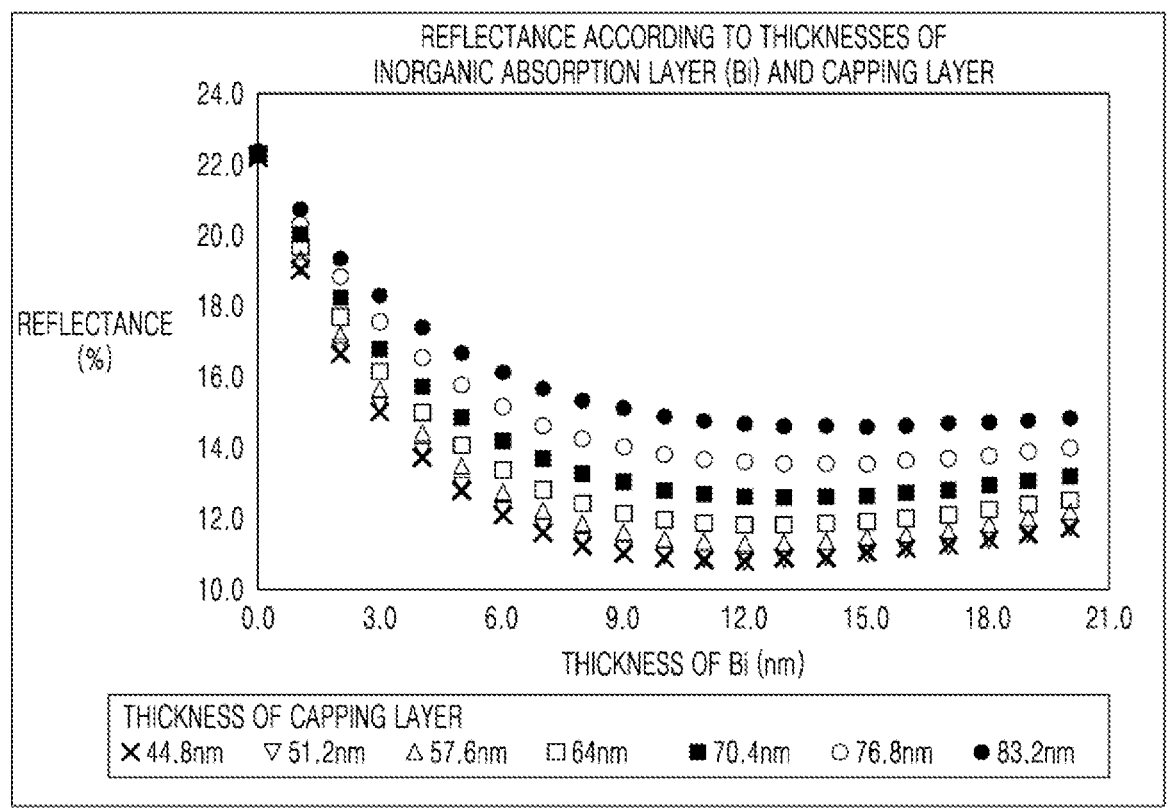
Figure 8A:
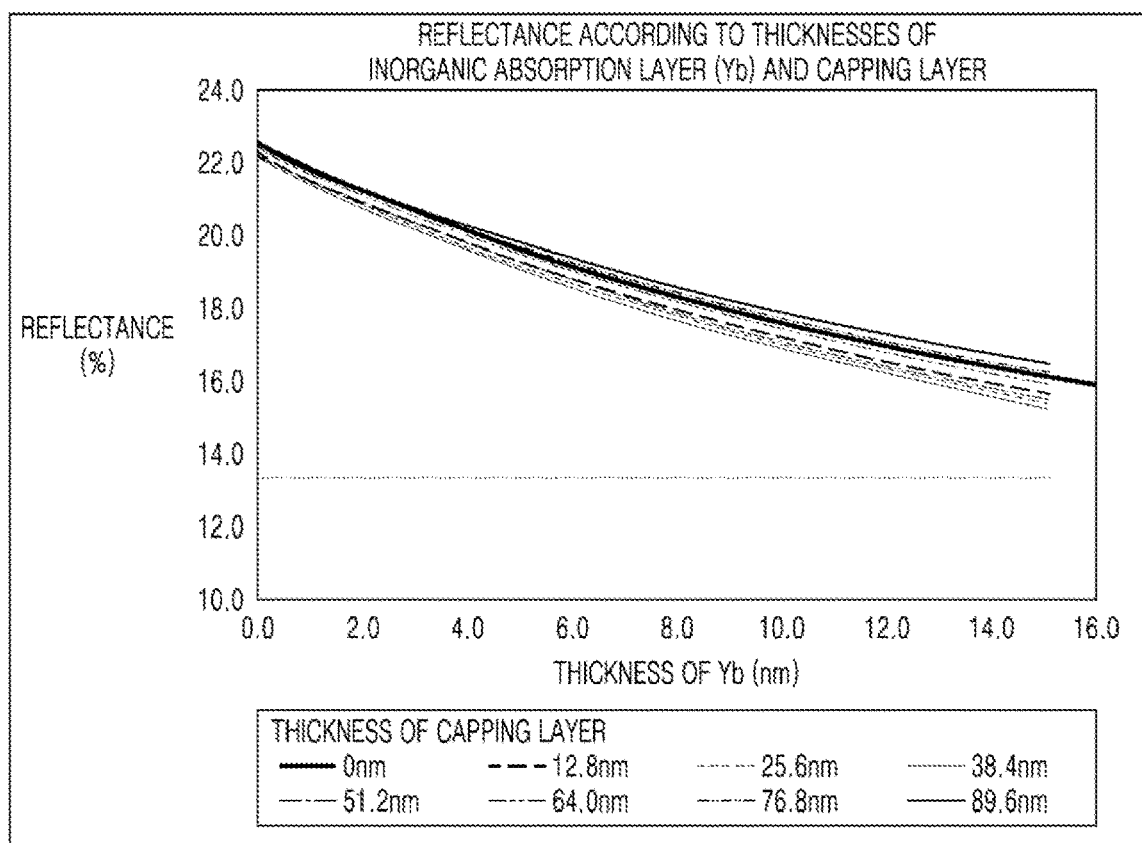
FIG. 8A shows a graphical depiction of several display apparatuses showing reflectance percent versus thicknesses of a capping layer and an inorganic absorption layer comprising ytterbium, and a graphical depiction of several display apparatuses showing current efficiency ratio versus thicknesses of a capping layer and an inorganic absorption layer comprising ytterbium.
Figure 8A:
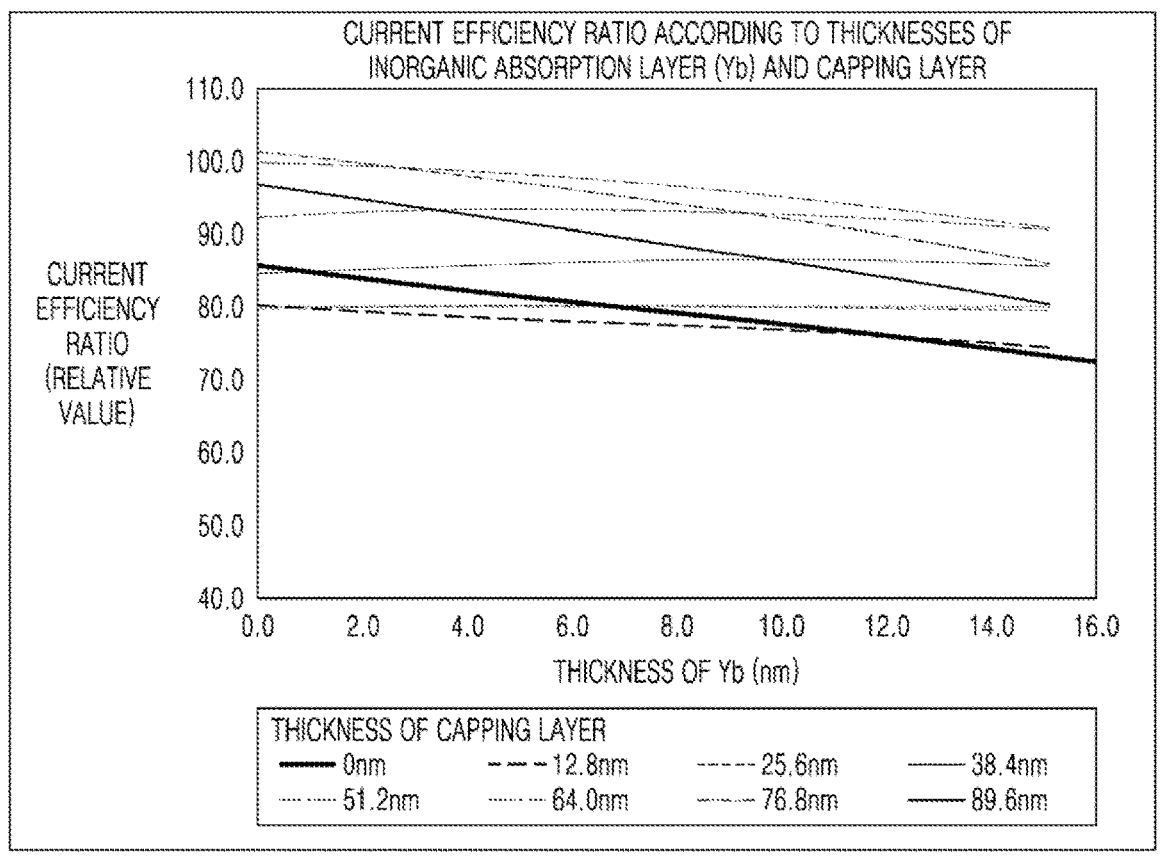
Figure 8B:
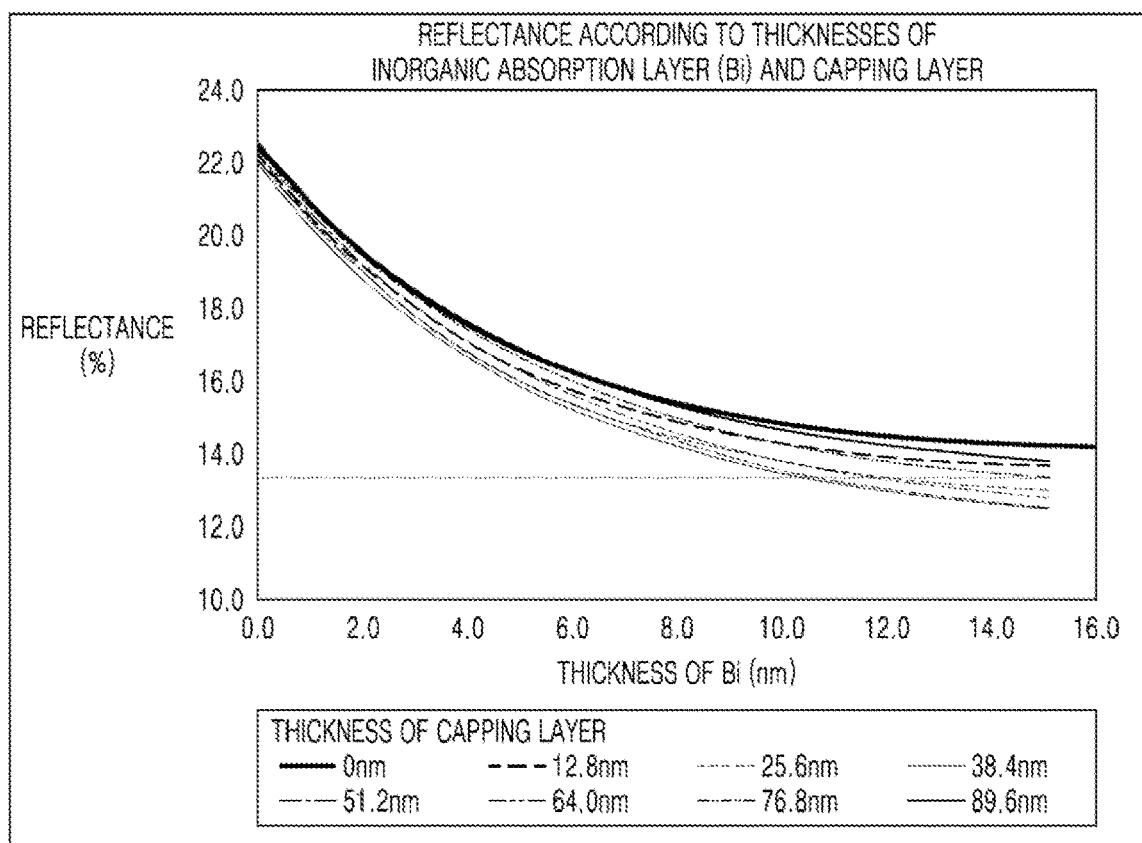
FIG. 8B shows a graphical depiction of several display apparatuses showing reflectance percent versus thicknesses of a capping layer and an inorganic absorption layer comprising bismuth, and a graphical depiction of several display apparatuses showing current efficiency ratio versus thicknesses of a capping layer and an inorganic absorption layer comprising bismuth.
Figure 8B:
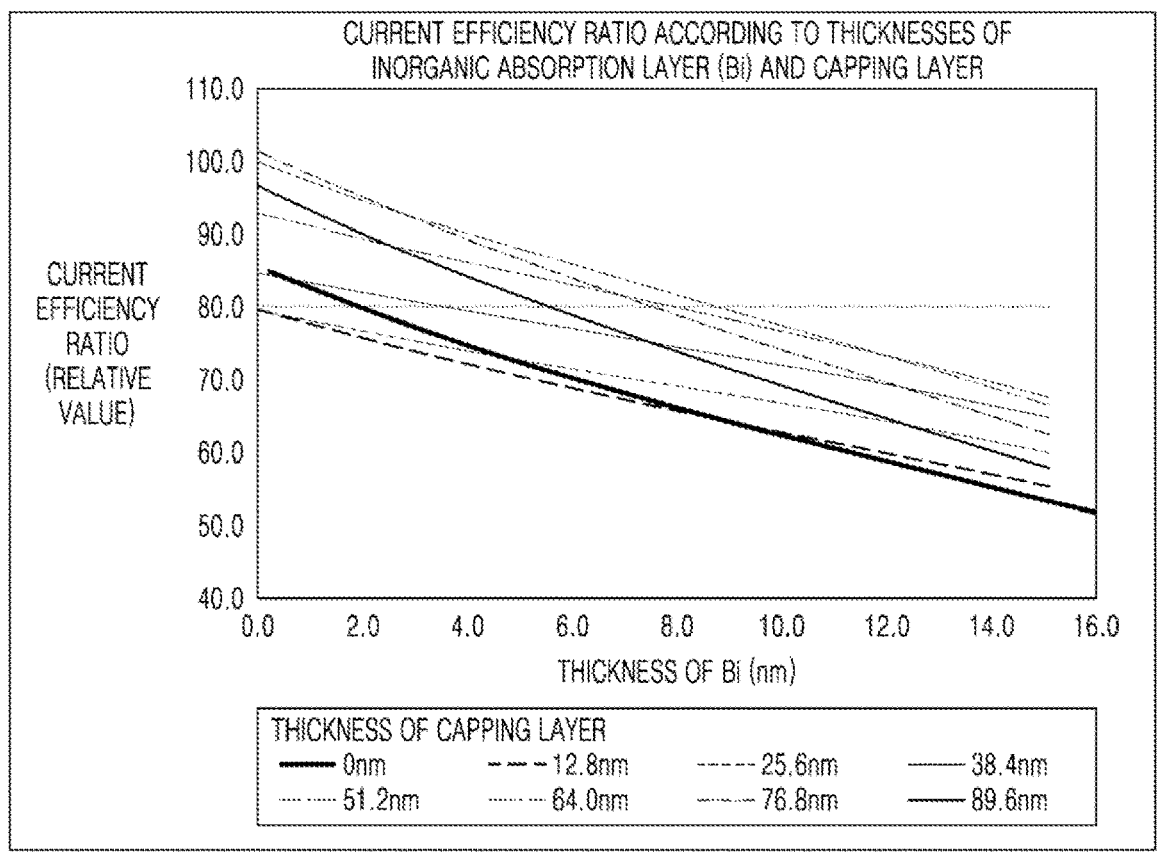
Figure 8C:
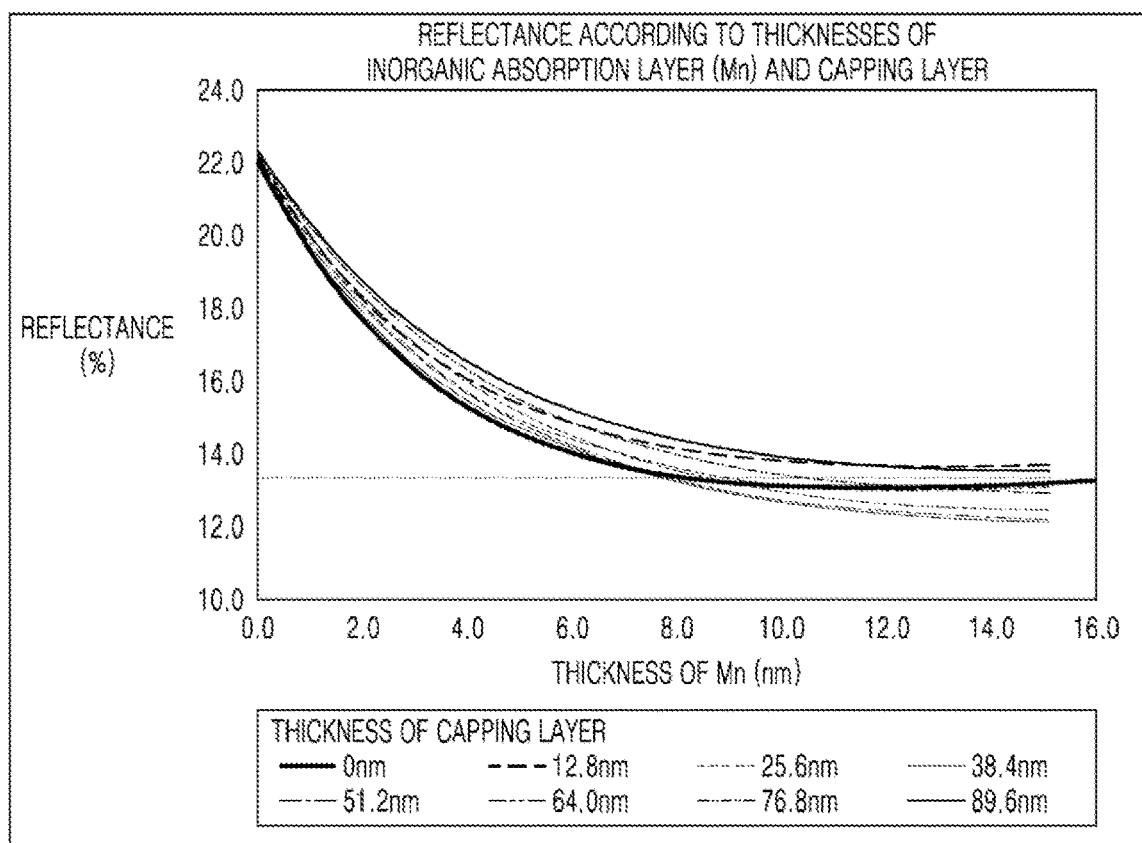
FIG. 8C shows a graphical depiction of several display apparatuses showing reflectance percent versus thicknesses of a capping layer and an inorganic absorption layer comprising manganese, and a graphical depiction of several display apparatuses showing current efficiency ratio versus thicknesses of a capping layer and an inorganic absorption layer comprising manganese.
Figure 8C:
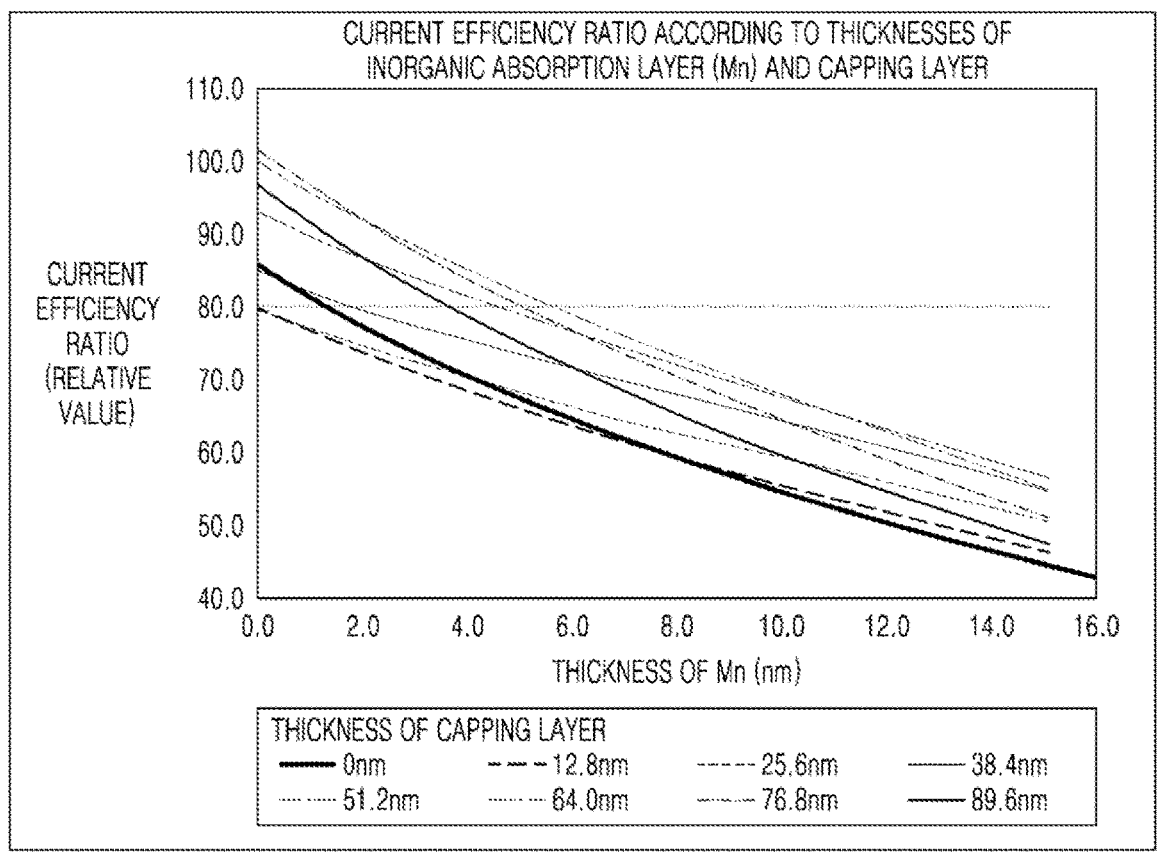

FIG. 7 shows a graphical depiction of several display apparatuses showing reflective percent versus thicknesses of a capping layer and an inorganic absorption layer comprising ytterbium, and a graphical depiction of several display apparatuses showing reflective percent versus thicknesses of a capping layer and an inorganic absorption layer comprising bismuth. FIG. 8A shows a graphical depiction of several display apparatuses showing reflectance percent versus thicknesses of a capping layer and an inorganic absorption layer comprising ytterbium, and a graphical depiction of several display apparatuses showing current efficiency ratio versus thicknesses of a capping layer and an inorganic absorption layer of ytterbium. FIG. 8B shows a graphical depiction of several display apparatuses showing reflectance percent versus thicknesses of a capping layer and an inorganic absorption layer comprising bismuth, and a graphical depiction of several display apparatuses showing current efficiency ratio versus thicknesses of a capping layer and an inorganic absorption layer comprising bismuth. FIG. 8C shows a graphical depiction of several display apparatuses showing reflectance percent versus thicknesses of a capping layer and an inorganic absorption layer comprising manganese, and a graphical depiction of several display apparatuses showing current efficiency ratio versus thicknesses of a capping layer and an inorganic absorption layer comprising manganese.

Referring back to FIGS. 2A-2B, by varying the material and thickness of the inorganic absorption layer 500 and the thickness of the capping layer 600, the tendency of reflectance and current efficiency ratio of a display apparatus was measured and is shown in FIGS. 7 and 8A to 8C. In FIGS. 8A to 8C, the current efficiency ratio is expressed as a relative value with respect to a current efficiency of the display apparatus that does not include an inorganic absorption layer.

Display apparatuses constructed according to the principles and embodiments of the invention have excellent spectral characteristics because external light reflectance is reduced to improve visibility, light efficiency is high, and a color coordinate change according to a viewing angle is reduced.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
    a substrate;
    a display device layer disposed on the substrate and comprising an organic light-emitting device;
    a low-reflection inorganic layer disposed on the display device layer and comprising an inorganic material;
    a capping layer disposed on the low-reflection inorganic layer, and
    a reflection adjusting layer disposed on the capping layer.

2. The display apparatus of claim 1, wherein the inorganic material has a refractive index of about 1 or more.

3. The display apparatus of claim 1, wherein the inorganic material has an absorption coefficient of about 0.5 or more.

4. The display apparatus of claim 1, wherein the inorganic material comprises ytterbium, bismuth, cobalt, molybdenum, titanium, zirconium, aluminum, chromium, niobium, platinum, tungsten, indium, tin, iron, nickel, tantalum, manganese, zinc, germanium, or a combination thereof.

5. The display apparatus of claim 1, wherein the low-reflection inorganic layer is made by thermally depositing the inorganic material.

6. The display apparatus of claim 1, wherein the low-reflection inorganic layer has a thickness from about 0.1 nm to about 50 nm.

7. The display apparatus of claim 1, wherein the reflection adjusting layer comprises a dye, a pigment, or a combination thereof.

8. The display apparatus of claim 1, wherein the reflection adjusting layer has a maximum absorption wavelength in a first region of about 480 nm to about 510 nm or a second region of about 580 nm to about 610 nm.

9. The display apparatus of claim 1, wherein the reflection adjusting layer comprises a compound comprising an oxazine moiety, a compound comprising a cyanine moiety, a compound comprising a tetraazoporphine moiety, or a compound comprising a squarylium moiety.

10. The display apparatus of claim 1, wherein the capping layer comprises an organic capping layer including an organic material, an inorganic capping layer including an inorganic material, or a composite capping layer including an organic material and an inorganic material.

11. The display apparatus of claim 1, wherein the capping layer has a thickness from about 1 nm to about 200 nm.

12. The display apparatus of claim 1, further comprising an encapsulation layer on the capping layer.

13. The display apparatus of claim 12, wherein the encapsulation layer comprises an encapsulation portion and further comprising an input sensing member between the encapsulation portion and the reflection adjusting layer.

14. The display apparatus of claim 1, wherein
    the organic light-emitting device comprises: a pixel electrode; an interlayer disposed on the pixel electrode and comprising an emission layer; and an opposite electrode disposed on the interlayer.

15. The display apparatus of claim 1, wherein the display apparatus excludes a polarizing plate.

16. The display apparatus of claim 1, wherein the display apparatus excludes a color conversion member or a wavelength conversion member.

17. The display apparatus of claim 1, further comprising a thin-film transistor,
    wherein the thin-film transistor is electrically connected to the organic light-emitting device.

18. The display apparatus of claim 17, wherein the thin-film transistor comprises a semiconductor layer and a gate electrode, the gate electrode overlapping a channel area of the semiconductor layer.

19. A display apparatus comprising:
    a substrate;
    a display device layer disposed on the substrate and comprising an organic light-emitting device;
    a low-reflection inorganic layer disposed on the display device layer and comprising an inorganic material;
    a capping layer disposed on the low-reflection inorganic layer, and
    a reflection adjusting layer disposed on the capping layer,
    wherein an input sensing layer is between the capping layer and the reflection adjusting layer, and
    the input sensing layer comprises a touch electrode layer.

20. A display apparatus comprising:
    a substrate;
    a display device layer disposed on the substrate and comprising an organic light-emitting device;
    a low-reflection inorganic layer disposed on the display device layer and comprising an inorganic material;
    a capping layer disposed on the low-reflection inorganic layer,
    a reflection adjusting layer disposed on the capping layer; and
    an encapsulation layer on the capping layer,
    wherein the encapsulation layer comprises a sealing portion and an encapsulation substrate.

* * * * *